United States Patent
Momoi et al.

(10) Patent No.: US 6,639,327 B2
(45) Date of Patent: Oct. 28, 2003

(54) SEMICONDUCTOR MEMBER, SEMICONDUCTOR DEVICE AND MANUFACTURING METHODS THEREOF

(75) Inventors: Kazutaka Momoi, Kanagawa (JP); Takao Yonehara, Kanagawa (JP); Nobuhiko Sato, Kanagawa (JP); Masataka Ito, Kanagawa (JP); Noriaki Honma, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/899,257

(22) Filed: Jul. 6, 2001

(65) Prior Publication Data
US 2002/0024152 A1 Feb. 28, 2002

(30) Foreign Application Priority Data

Jul. 10, 2000 (JP) .................................. 2000-208305
Mar. 28, 2001 (JP) .................................. 2001-092792
Apr. 5, 2001 (JP) .................................. 2001-107340

(51) Int. Cl.$^7$ ............................................. H01L 23/58
(52) U.S. Cl. ................... 257/913; 257/131; 257/607; 257/608; 257/609; 257/610; 257/611; 257/612
(58) Field of Search ................... 257/607–612, 257/913, 131

(56) References Cited

U.S. PATENT DOCUMENTS

| | | | | |
|---|---|---|---|---|
| 4,915,806 A | * | 4/1990 | Lardon et al. | 427/524 |
| 4,931,405 A | * | 6/1990 | Kamijo et al. | 438/143 |
| 5,459,084 A | * | 10/1995 | Ryum et al. | 438/318 |
| 5,482,869 A | * | 1/1996 | Kohyama | 438/476 |
| 5,757,063 A | * | 5/1998 | Tomita et al. | 257/610 |
| 5,773,152 A | | 6/1998 | Okonogi | 428/446 |
| 6,040,610 A | * | 3/2000 | Noguchi et al. | 257/392 |
| 6,057,036 A | | 5/2000 | Okonogi | 428/426 |
| 6,090,648 A | * | 7/2000 | Reedy et al. | 438/155 |
| 6,165,872 A | * | 12/2000 | Kageyama | 438/455 |
| 6,372,611 B1 | * | 4/2002 | Horikawa | 438/473 |
| 6,465,241 B2 | * | 10/2002 | Haronian et al. | 435/287.2 |
| 2002/0061519 A1 | * | 5/2002 | Haronian et al. | 435/6 |

FOREIGN PATENT DOCUMENTS

| | | |
|---|---|---|
| JP | 6-163862 | 6/1994 |
| JP | 8-116038 | 5/1996 |
| JP | 8-293589 | 11/1996 |

OTHER PUBLICATIONS

J. Wong–Leung, et al., "The Precipitation of Fe at the Si–SiO$_2$ Interface", J. Appl. Phys., vol. 83, No. 1, pp. 580–584 (1998).

M. Zhang, et al., "Gettering of Cu by Microcavities in Bonded/Ion–Cut Silicon–on–Insulator and Separation by Implantation of Oxygen", J. Appl. Phys., vol. 86, No. 8, pp. 4214–4219 (1999).

M. Shabani, et al., "Low–Temperature Out–Diffusion of Cu from Silicon Wafers", J. Electrochem. Soc., vol. 143, No. 6, pp. 2025–2029 (1996).

* cited by examiner

Primary Examiner—Amir Zarabian
Assistant Examiner—Ida M. Soward
(74) Attorney, Agent, or Firm—Fitzpatrick, Cella, Harper & Scinto

(57) ABSTRACT

In a bonded semiconductor member, microgaps are formed on a substrate side of a bonding interface to thereby constitute a gettering site, and heavy metal elements contaminated in the substrate are captured by the microgaps. The bonded semiconductor member is manufactured by interposing the microgaps between two substrates.

15 Claims, 12 Drawing Sheets

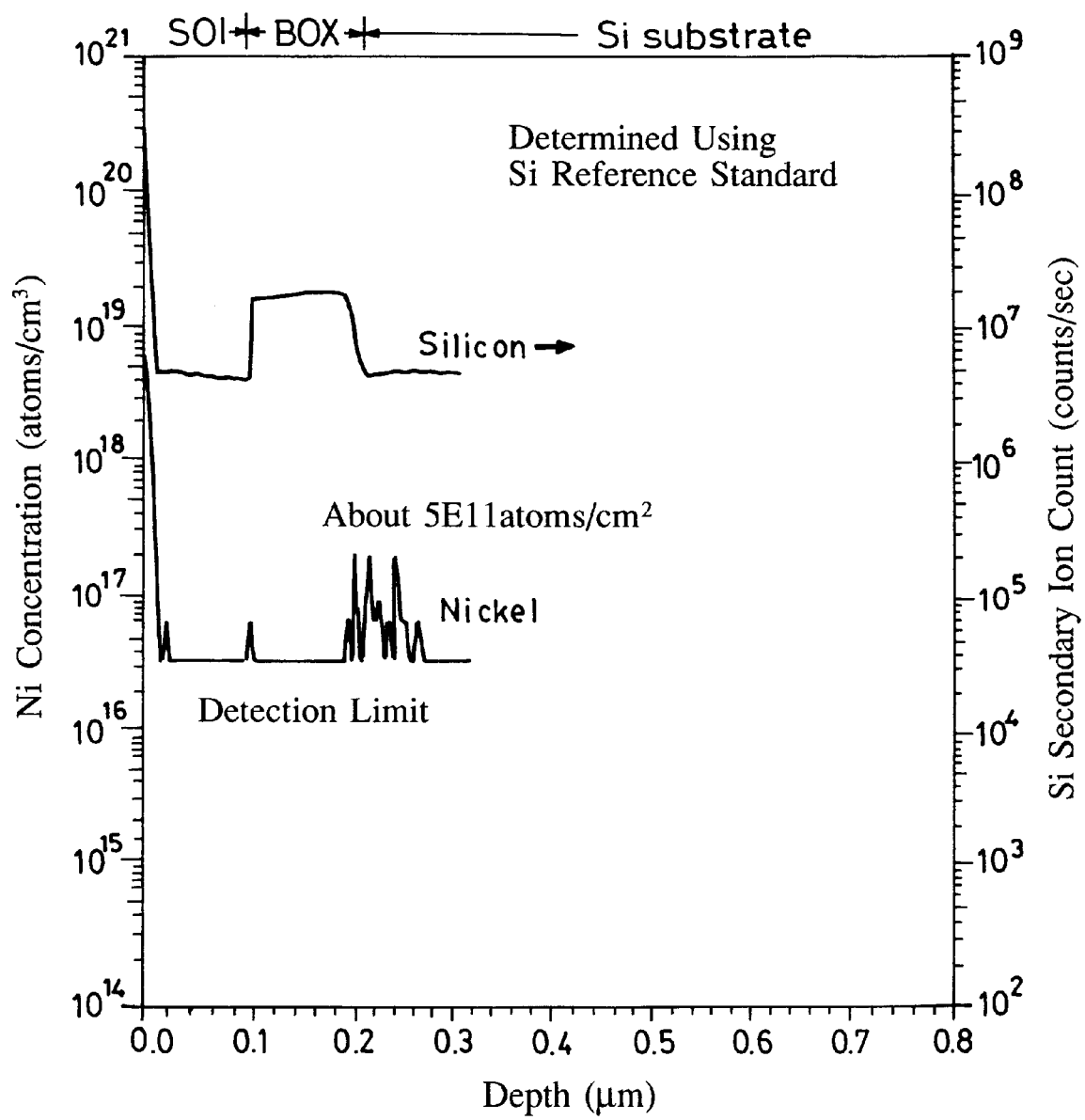

SEMICONDUCTOR MEMBER, SEMICONDUCTOR DEVICE AND MANUFACTURING METHODS THEREOF

BACKGROUND OF THE INVENTION

1. Field of the Invention

The present invention relates to semiconductor members and semiconductor devices which are useful for silicon-on-insulator (SOI) devices and to methods for manufacturing these semiconductor members and devices. Specifically, the present invention relates to semiconductor members and semiconductor devices which are capable of gettering heavy metal elements and to methods for manufacturing these semiconductor members and devices.

2. Description of the Related Art

Known semiconductor members include, for example, substrates having at least two laminated layers composed of different types of semiconductor materials and SOI substrates each composed of a semiconductor layer laminated on an insulating layer.

In bulk Si wafers, ultra-high purity crystals can be obtained by typical wafer manufacturing methods such as the Czpchralski process (CZ process), since segregation coefficients of heavy metal elements in Si crystals are very low.

In contrast, SOI wafers use bulk Si as a starting material and inevitably undergo a heat treatment process for the formation of an insulating layer or for the smoothing of the surface in any manufacturing method. In the heat treatment process, heavy metal elements contained in a furnace or in a heater tend to flow into the stream of a gas at high temperatures and possibly diffuse into an SOI wafer during its manufacture.

When ion implantation is used in the manufacture, a member in an evacuated housing or in the passage of implanted ions is irradiated with ions, the component elements of the member are ionized, and the resulting ions can be implanted into an SOI wafer during its manufacture, together with a principle ion to be implanted into the wafer.

Heavy metal elements entering in an Si crystal freely diffuse in the crystal during a treatment at high temperatures, but gradually become limited in diffusion in a cooling process, and are ultimately fixed by the formation of silicide compounds by a reaction with Si or the formation of oxides by a reaction with oxygen. For example, Ni and Cu are known to form silicides to thereby accumulate in the circumference of minute defects in the Si crystal, as described by Takao Abe in "Silicon: Crystal Growth and Wafer Processing", pp. 233, Baifukan. Fe is also known to form a silicide in the interface between Si and $SiO_2$ to thereby segregate when it diffuses in an Si crystal having an oxide film, as described in J. Appl. Phys., 83, 583 (1998).

Such heavy metal elements may form defects in Si crystals and may form deep levels in an Si band gap in some cases. If a defect is formed in a single-crystal semiconductor layer as an active device region, a chip manufactured in this region becomes defective. The formation of a deep level by such a heavy metal element causes changes in electrical properties of the chip to thereby decrease the yield of chips. The ratio of the defects or level-forming regions to the size of the device increases with further enhanced miniaturization and higher density packing of devices, and very strong demands have been made to remedy contamination with heavy metal elements.

Such a device manufacturing operation includes a number of processes, and it is difficult to always maintain all the processes under normal conditions. Accordingly, unexpected abnormalities may occur in some processes to thereby allow heavy metal elements to contaminate a wafer during its manufacture. It takes many days to manufacture devices, and if an abnormality in an intermediate process is found after finished devices are obtained, all the wafers in the manufacturing operation at that time potentially are defective.

To avoid this problem, in bulk Si wafers, a gettering site for gettering heavy metal elements is formed in the back or inside of the wafer to thereby prevent unexpected contamination of the wafer with heavy metal elements during the manufacturing process.

The following gettering techniques are well known and are effectively used to remove heavy metal elements from the active device region in the device process.

1. Gettering heavy metal elements inside the wafer by intrinsic gettering utilizing the precipitation of oxygen in Z wafers;
2. Gettering heavy metal elements in the back of the wafer by extrinsic gettering such as backside damage, the formation of a polysilicon film, and the diffusion of phosphorus.

SOI wafers are also starting materials of the device process as bulk Si, and in these wafers, increasing demands have been made to remedy contamination with heavy metal elements. SOI wafer fabricators have made intensive efforts to remedy heavy metal contamination mainly along a course to avoid contamination with heavy metal elements during the manufacturing process.

However, heavy metal element contamination, which may occur in the heat treatment process, cannot be significantly prevented, and the heavy metal contamination levels of all the product SOI wafers cannot be strictly ensured. Additionally, if the wafer is contaminated with heavy metal elements through the heat treatment or ion implantation during the manufacturing process of an SOI wafer, the SOI wafer must have a gettering site gettering these heavy metal elements.

Even if SOI wafers having a perfect crystal quality are manufactured, the chip yield may be decreased due to heavy metal element contamination when heavy metal elements contaminate the wafers in the heat treatment operation of the device process.

In SOI wafers, a semiconductor element or device such as a transistor is formed in a limited region, that is, an ultrathin single-crystal Si region on an insulating layer (oxide film). If this region is free from contamination with heavy metal elements and the oxide film as an insulating layer is uniformly formed, the chip yield can be prevented from decreasing due to heavy metal element contamination.

The manufacturing methods of SOI wafers are roughly classified under two groups: a separation by ion-implanted oxygen (SIMOX) process in which oxygen ions are implanted into an Si single-crystal substrate to thereby form an insulating layer; and a bonding process in which two different semiconductor substrates are bonded and a single-crystal semiconductor layer is formed by polishing or separation.

The oxide film (insulating layer) in the bonded SOI wafer is composed of a uniform thermal oxide film and is believed to have a higher quality than that of the oxide film of the SIMOX SOI wafer formed by oxygen ion implantation and annealing. Additionally, the SIMOX SOI wafer tends to have crystal defects in the single-crystal semiconductor layer induced by oxygen ion implantation. Accordingly, the bonding process is believed to more easily manufacture high-quality SOI wafers than the SIMOX process.

In the SIMOX process, it is known that oxidation induced stacking faults (OSFs) are formed immediately below the insulating layer simultaneously with the formation of the insulating layer. Cu and Ni, which may contaminate the wafer in the heat treatment process, are captured by OSFs, and the single-crystal semiconductor layer becomes resistant to heavy metal element contamination. This means that a gettering site is spontaneously formed without any extra process in the SIMOX manufacturing process and that the SIMOX process is superior in cost to the bonding process.

In the bonded SOI wafers, attempts have also been made to form a gettering site inside the substrate to thereby getter heavy metal elements.

For example, in a method described in Japanese Patent Laid-Open No. 6-163862, a layer in which a high concentration of phosphorus atoms is diffused, an ion implantation layer, or a lattice mismatching layer is formed on one of two substrates to be bonded, and the formed layer plays a role as a gettering site.

In a method described in Japanese Patent Laid-Open No. 8-293589, the substrate side of a wafer is subjected to a two-stage heat treatment to thereby form an oxygen precipitate, and dislocations are introduced in the vicinity of the surface of the wafer by heat stress in a cooling operation to form two gettering sites.

In a method described in Japanese Patent Laid-Open No. 8-116038, a layer in which phosphorus atoms are diffused in a high concentration on the back of a substrate plays a role as a gettering site.

Miao Zhang, et al., mention that, when a multiplicity of microcavities are formed in an SOI wafer by hydrogen or helium ion implantation and a subsequent heat treatment, the microcavities getter metal impurities. J. Appl. Phys., vol. 86, no. 8 (1999).

Such conventional SOI substrates will be illustrated below with reference to the drawings.

FIG. 16 is a sectional view showing an SOI substrate as a conventional semiconductor member.

SOI substrate 1 includes substrate 2 composed of a single-crystal semiconductor such as a silicon wafer, buried insulating layer 3 formed on substrate 2, and single-crystal semiconductor layer 4 composed of silicon formed on buried insulating layer 3. By ion implantation from the surface of SOI substrate 1 and heat treatment, a multiplicity of microcavities 6 is formed in layer region 5 having a predetermined depth from the upper interface of substrate 2.

FIG. 17 is a sectional view showing another conventional SOI substrate. In this SOI substrate, a multiplicity of microcavities 6 is formed in single-crystal semiconductor layer 4.

However, according to these conventional technologies, a heat treatment for gettering metal impurities by microcavities may destroy the microcavities to thereby invite cracking in the layer region having the microcavities in some cases.

In particular, the amount and location of microcavities formed by ion implantation and heat treatment depend on the implantation energy and dose of the implanted ion species, and the formed microcavities show a certain distribution in the range of implanted ions. Accordingly, the layer region having the microcavities has a large thickness, and a multiplicity of microcavities is formed so as to overlap with one another in the thickness direction in the layer region, thus deteriorating the mechanical strengths of the layer region. In some cases, microcavities are formed in unexpected areas, and metal impurities are captured by the formed microcavities, thus adversely affecting the manufacture and design of semiconductor devices.

When microcavities are formed after the formation of an SOI substrate, ions are implanted through the semiconductor layer to thereby invite defects to occur in the semiconductor layer.

As thus described, conventional technologies are still insufficient and must be improved to provide semiconductor members which are practical and have satisfactory characteristics.

SUMMARY OF THE INVENTION

Accordingly, an object of the present invention is to provide a semiconductor member and semiconductor device which are practical and have more satisfactory characteristics than conventional equivalents and to provide methods for manufacturing thus semiconductor member and semiconductor device.

Another object of the present invention is to provide a semiconductor member and semiconductor device which have a satisfactory gettering capability, which can prevent destruction of microcavities and can maintain the mechanical strengths of the semiconductor member and to provide methods for manufacturing thus semiconductor member and semiconductor device.

A further object of the present invention is to provide a method for manufacturing a semiconductor member, which method can easily form a gettering site.

Specifically, the present invention provides, in an aspect, a semiconductor member including a substrate, an insulating layer formed on the substrate, and a semiconductor layer formed on the insulating layer, and the semiconductor member includes a monolayer region having plural microgaps for gettering metal impurities, which plural microgaps are arranged along an interface inside the semiconductor member.

The interface is preferably an interface between the semiconductor layer and the insulating layer.

The interface is preferably a bonding interface.

Preferably, the insulating layer is a buried insulating layer formed on the substrate, the semiconductor layer is a single-crystal semiconductor layer formed on the buried insulating layer, and the interface is an interface between the single-crystal semiconductor layer and the buried insulating layer or an interface between the buried insulating layer and the substrate.

The concentration of Ni captured in the monolayer region is preferably equal to or less than $5 \times 10^{10}$ per square centimeter.

It is preferred that the insulating layer is a buried insulating layer formed on the substrate, the semiconductor layer is a single-crystal semiconductor layer formed on the buried insulating layer, and the lengths of the microgaps in the thickness direction are shorter than the thickness of the single-crystal semiconductor layer or of the buried insulating layer.

The microgaps are preferably box-shaped (rectangular) having a lengthwise side 10 nm to 100 nm long and a widthwise side 10 nm to 100 nm long in a plane substantially in parallel with the interface. Alternately, microgaps which are not box-shaped, have having an area equivalent to that of a box of the abovementioned dimensions.

The microgaps are preferably box-shaped having a lengthwise side and a widthwise side each substantially in parallel with the crystal orientations in a plane substantially in parallel with the interface.

The density of the microgaps in a plane along the interface is preferably in a range from $5\times10^9$ per square centimeter to $5\times10^{11}$ per square centimeter.

The inner surfaces of the microgaps are preferably each coated with a film.

In another aspect, the present invention provides a method for manufacturing a semiconductor member, which semiconductor member includes a substrate, an insulating layer formed on the substrate, and a semiconductor layer formed on the insulating layer, and has a monolayer region having plural microgaps, which plural microgaps are arranged along an interface inside the semiconductor member. The method includes the steps of:

preparing a first substrate and a second substrate, which first substrate includes a transfer layer region having the semiconductor layer; and transferring the transfer layer region from the first substrate to the second substrate. The transferring step includes a step of bonding the first substrate with the second substrate so as to interpose the plural microgaps for gettering metal impurities between the first substrate and the second substrate.

The interface is preferably an interface between the semiconductor layer and the insulating layer.

Preferably, one of the surface of the transfer layer region and the surface of the second substrate is an insulative surface, and the other is a semiconductor surface, and the bonding step includes a step of bringing these two surfaces into close contact with each other.

The bonding procedure is preferably performed under bonding conditions suitable to interpose the microgaps between surfaces to be bonded.

Under bonding conditions, it is preferred that the surfaces to be bonded are made hydrophobic, an oxidizing atmosphere is used as an atmosphere for bonding, and a heat treatment for improving a bonding strength is performed at a temperature equal to or higher than 900° C.

Under bonding conditions, the temperature of the substrate at an early stage of epitaxial growth of the semiconductor layer is preferably set at 900° C. to 1100° C.

Under bonding conditions, the temperature of the substrate in a heat treatment for bonding is preferably set at 900° C. to 1200° C.

Under bonding conditions, the surfaces to be bonded are preferably cleaned with a solution containing hydrogen fluoride.

Under bonding conditions, the bonding procedure is performed in an atmosphere containing at least one of water and oxygen.

A substrate including a transfer layer region having a separation layer and the semiconductor layer formed on the separation layer is preferably prepared as the first substrate.

The separation layer is preferably a layer having relatively low mechanical strength.

The separation layer is preferably a porous layer formed by anodization.

Alternatively, the separation layer is preferably a layer formed by ion implantation.

The method preferably further includes a step of removing a portion of the first substrate other than the transfer layer region having the semiconductor layer.

The method preferably further includes, after the bonding step, a step of gettering metal impurities by the monolayer region having the plural microgaps arranged therein.

The method preferably includes a heat treatment in an inert atmosphere or reducing atmosphere as a step of gettering metal impurities by the monolayer region having the plural microgaps arranged therein.

The metal impurity may be at least one of Cr, Fe, Ni and Cu.

In a further aspect, the present invention provides a semiconductor device including a semiconductor member and a semiconductor element, which semiconductor member includes a substrate, a buried insulating layer formed on the substrate, and a single-crystal semiconductor layer formed on the buried insulating layer, and which semiconductor element is formed in the single-crystal semiconductor layer of the semiconductor member, in which the semiconductor member includes a monolayer region for gettering metal impurities, which monolayer region has plural microgap arranged along at least one interface of the buried insulating layer.

Preferably, metal impurities are captured by the monolayer region.

The metal impurities may be at least one of Cr, Fe, Ni and Cu.

Preferably, the semiconductor element is a fully depleted insulated gate transistor, and the microgaps are arranged along an interface between the buried insulating layer and the substrate.

Alternatively, it is preferred that the semiconductor element is a partially depleted insulated gate transistor, and the microgaps are arranged along an interface between the buried insulating layer and the substrate.

Alternatively, it is preferred that the semiconductor element is a partially depleted insulated gate transistor, and the microgaps are arranged along an interface between the buried insulating layer and the semiconductor layer.

In yet another aspect, the present invention provides a method for manufacturing a semiconductor device, which semiconductor device includes a semiconductor member and a semiconductor element, and the semiconductor member includes a substrate, a buried insulating layer formed on the substrate, and a single-crystal semiconductor layer formed on the buried insulating layer, and the semiconductor element is formed in the single-crystal semiconductor layer of the semiconductor member. This method includes the steps of forming the semiconductor element, and gettering metal impurities by a monolayer region at least during or after the forming step, which monolayer region has plural microgaps arranged along at least one interface of the buried insulating layer.

The present invention provides, in another aspect, a semiconductor member including a substrate, an insulating layer formed on the substrate, and a semiconductor layer formed on the insulating layer, in which plural microgaps for gettering metal impurities are arranged along an interface inside the semiconductor member so as not to overlap one another in the thickness direction of the semiconductor member.

The present invention provides, in a further aspect, a method for manufacturing a semiconductor member, which semiconductor member includes a substrate, an insulating layer formed on the substrate, and a semiconductor layer formed on the insulating layer, and plural microgaps for gettering metal impurities are arranged along an interface inside the semiconductor member so as not to overlap one another in the thickness direction of the semiconductor member. This method includes the steps of preparing a first substrate and a second substrate, which first substrate includes a transfer layer region having the semiconductor layer, and transferring the transfer layer region from the first substrate to the second substrate, in which the transferring step includes a step of bonding the first substrate with the second substrate so as to interpose the plural microgaps for gettering metal impurities between the first substrate and the second substrate.

The present invention provides, in yet another aspect, a semiconductor device including a semiconductor member and a semiconductor element, which semiconductor member includes a substrate, a buried insulating layer formed on the substrate, and a single-crystal semiconductor layer formed on the buried insulating layer, and which semiconductor element is formed in the single-crystal semiconductor layer of the semiconductor member, in which plural microgaps for gettering metal impurities are arranged along at least one interface of the buried insulating layer so as not to overlap one another in the thickness direction of the semiconductor member.

The present invention provides, in a still further aspect, a method for manufacturing a semiconductor device, which semiconductor device includes a semiconductor member and a semiconductor element, and the semiconductor member includes a substrate, a buried insulating layer formed on the substrate, and a single-crystal semiconductor layer formed on the buried insulating layer, and the semiconductor element is formed in the single-crystal semiconductor layer of the semiconductor member. This method includes the steps of forming the semiconductor element, and gettering metal impurities by plural microgaps at least during or after the forming step, which microgaps are arranged along an interface of the buried insulating layer so as not to overlap one another in the thickness direction of the semiconductor member.

The present invention provides, in still another aspect, a semiconductor member including a substrate, an insulating layer formed on the substrate, and a semiconductor layer formed on the insulating layer, in which plural microgaps having a length from 10 nm to 100 nm and a width from 10 nm to 100 nm are dispersed and arranged at a density from $5\times10^9$ per square centimeter to $5\times10^{11}$ per square centimeter along a plane substantially in parallel with the surface of the semiconductor member.

In another aspect, the present invention provides a method for manufacturing a semiconductor member, which semiconductor member includes a substrate, an insulating layer formed on the substrate, and a semiconductor layer formed on the insulating layer, and in which plural microgaps having a length from 10 nm to 100 nm and a width from 10 nm to 100 nm are dispersed and arranged at a density from $5\times10^9$ per square centimeter to $5\times10^{11}$ per square centimeter along a plane substantially in parallel with the surface of the semiconductor member. This method includes the steps of preparing a first substrate and a second substrate, which first substrate includes a transfer layer region having the semiconductor layer and transferring the transfer layer region from the first substrate to the second substrate, and the transferring step includes a step of bonding the first substrate with the second substrate so as to interpose the plural microgaps between the first substrate and the second substrate.

In a further aspect, the present invention provides a semiconductor device including a semiconductor member and a semiconductor element, which semiconductor member includes a substrate, a buried insulating layer formed on the substrate, and a single-crystal semiconductor layer formed on the buried insulating layer, and which semiconductor element is formed in the single-crystal semiconductor layer of the semiconductor member, in which plural microgaps having a length from 10 nm to 100 nm and a width from 10 nm to 100 nm are dispersed and arranged at a density from $5\times10^9$ per square centimeter to $5\times10^{11}$ per square centimeter along at least one interface of the buried insulating layer.

In yet another aspect, the present invention provides a method for manufacturing a semiconductor device, which semiconductor device includes a semiconductor member and a semiconductor element, and the semiconductor member includes a substrate, a buried insulating layer formed on the substrate, and a single-crystal semiconductor layer formed on the buried insulating layer, and the semiconductor element is formed in the single-crystal semiconductor layer of the semiconductor member. This method includes the step of performing a heat treatment at least during or after a step of forming the semiconductor element, to thereby getter metal impurities by plural microgaps, which plural microgaps each have a length from 10 nm to 100 nm and a width from 10 nm to 100 nm and are dispersed and arranged at a density from $5\times10^9$ per square centimeter to $5\times10^{11}$ per square centimeter along at least one interface of the buried insulating layer.

In still another aspect, the present invention provides a semiconductor member including a monolayer region for gettering metal impurities, which monolayer region has plural microgaps arranged along an interface inside the semiconductor member.

In a further aspect, the present invention provides a method for manufacturing a semiconductor member, which semiconductor member includes a monolayer region for gettering metal impurities, and which monolayer region has plural microgaps arranged along an interface inside the semiconductor member. This method includes the steps of preparing a first substrate and a second substrate, which first substrate includes a transfer layer region having a semiconductor layer, and transferring the transfer layer region from the first substrate to the second substrate, and the transferring step includes a step of bonding the first substrate with the second substrate so as to interpose the plural microgaps for gettering metal impurities between the first substrate and the second substrate.

The present invention provides, in another aspect, a semiconductor device including a semiconductor member and a semiconductor element, which semiconductor member includes a single-crystal semiconductor layer, and which semiconductor element is formed in the single-crystal semiconductor layer, and the semiconductor member further includes a monolayer region for gettering metal impurities, which monolayer region has plural microgaps arranged along at least one interface.

The present invention provides, in a further aspect, a method for manufacturing a semiconductor device, which semiconductor device includes a semiconductor member and a semiconductor element, and the semiconductor member has a single-crystal semiconductor layer, and the semiconductor element is formed in the single-crystal semiconductor layer. This method includes the steps of forming the semiconductor element, and gettering metal impurities by a monolayer region at least during or after the forming step, which monolayer region has plural microgaps arranged along an interface inside the semiconductor member.

The present invention provides, in yet another aspect, a semiconductor member including plural microgaps for gettering metal impurities, which plural microgaps are arranged along an interface inside the semiconductor member so as not to overlap one another in the thickness direction of the semiconductor member.

The present invention provides, in still another aspect, a method for manufacturing a semiconductor member, which semiconductor member includes plural microgaps arranged along an interface inside the semiconductor member so as not to overlap one another in the thickness direction of the semiconductor member. This method includes the steps of preparing a first substrate and a second substrate, which first substrate includes a transfer layer region having a semiconductor layer, and transferring the transfer layer region from the first substrate to the second substrate, and the transferring step includes a step of bonding the first substrate with the second substrate so as to interpose the plural microgaps for gettering metal impurities between the first substrate and the second substrate.

The present invention provides, in a still further aspect, a semiconductor device including a semiconductor member and a semiconductor element, which semiconductor member includes a single-crystal semiconductor layer, and which semiconductor element is formed in the single-crystal semiconductor layer, in which plural microgaps for gettering metal impurities are arranged along an interface inside the semiconductor member so as not to overlap one another in the thickness direction of the semiconductor member.

The present invention provides, in still another aspect, a method for manufacturing a semiconductor device, which semiconductor device includes a semiconductor member and a semiconductor element, and the semiconductor member includes a single-crystal semiconductor layer, and the semiconductor element is formed in the single-crystal semiconductor layer. This method includes the steps of forming the semiconductor element, and gettering metal impurities by plural microgaps at least during or after the forming step, which plural microgaps are arranged along an interface inside the semiconductor member so as not to overlap one another in the thickness direction of the semiconductor member.

In another aspect, the present invention provides a semiconductor member including plural microgaps, which plural microgaps each have a length from 10 nm to 100 nm and a width from 10 nm to 100 nm and are dispersed and arranged at a density from $5 \times 10^9$ per square centimeter to $5 \times 10^{11}$ per square centimeter along a plane substantially in parallel with the surface of the semiconductor member.

In a further aspect, the present invention provides a method for manufacturing a semiconductor member, which semiconductor member includes plural microgaps, and the plural microgaps each have a length from 10 nm to 100 nm and a width from 10 nm to 100 nm and are dispersed and arranged at a density from $5 \times 10^9$ per square centimeter to $5 \times 10^{11}$ per square centimeter along a plane substantially in parallel with the surface of the semiconductor member. This method includes the steps of preparing a first substrate and a second substrate, which first substrate includes a transfer layer region having a semiconductor layer, and transferring the transfer layer region from the first substrate to the second substrate, and the transferring step includes a step of bonding the first substrate with the second substrate so as to interpose the plural microgaps between the first substrate and the second substrate.

In still another aspect, the present invention provides a semiconductor device including a semiconductor member and a semiconductor element, which semiconductor member includes a single-crystal semiconductor layer, and which semiconductor element is formed in the single-crystal semiconductor layer, in which plural microgaps having a length from 10 nm to 100 nm and a width from 10 nm to 100 nm are dispersed and arranged at a density from $5 \times 10^9$ per square centimeter to $5 \times 10^{11}$ per square centimeter along at least one interface.

In addition and advantageously, the present invention provides a method for manufacturing a semiconductor device, which semiconductor device includes a semiconductor member and a semiconductor element, and the semiconductor member includes a single-crystal semiconductor layer, and the semiconductor element is formed in the single-crystal semiconductor layer. This method includes the step of performing a heat treatment at least during or after a step of forming the semiconductor element, to thereby capture metal impurities by plural microgaps, which plural microgaps each have a length from 10 nm to 100 nm and a width from 10 nm to 100 nm and are dispersed and arranged at a density from $5 \times 10^9$ per square centimeter to $5 \times 10^{11}$ per square centimeter along at least one interface.

Further objects, features and advantages of the present invention will become apparent from the following description of the preferred embodiments with reference to the attached drawings.

BRIEF DESCRIPTION OF THE DRAWINGS

FIG. 10 is a graph showing gettering of metal impurities by a comparative sample;

DESCRIPTION OF THE PREFERRED EMBODIMENTS

Figure 1:
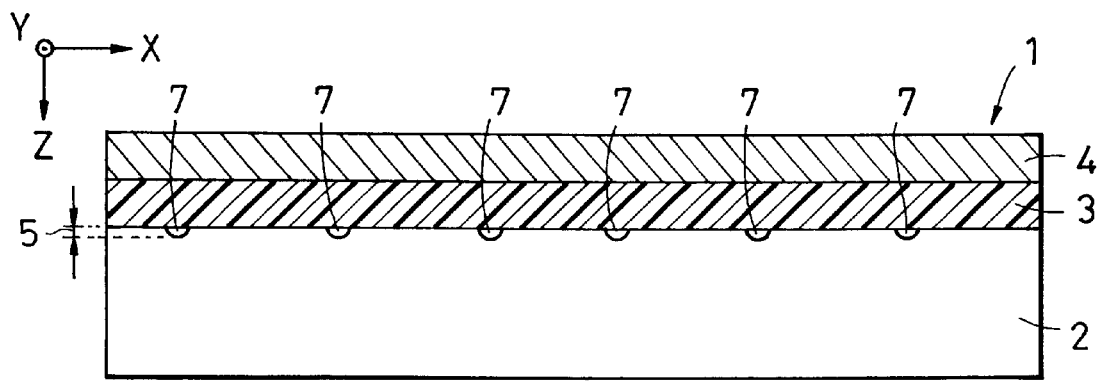
FIG. 1 is a schematic sectional view of a semiconductor member according to an embodiment of the present invention.

FIG. 1 is a schematic sectional view of a semiconductor member according to an embodiment of the present invention.

With reference to FIG. 1, the semiconductor member according to the present invention will be illustrated by taking an SOI substrate as an example, but the invention should not be limited to SOI substrates. SOI substrate 1 includes substrate 2, buried insulating layer 3 formed on substrate 2, and single-crystal semiconductor layer 4 formed on buried insulating layer 3. Substrate 2 is composed of, for example, a single-crystal semiconductor such as a silicon wafer, and semiconductor layer 4 is composed of, for example, single-crystal silicon.

Plural microgaps 7 are arranged along the lower interface of buried insulating layer 3. Most of plural microgaps 7 are dispersed and arranged in a plane (X-Y plane) in parallel with the surface of the semiconductor member, and microgaps 7 do not overlap one another in the depth direction Z (the thickness direction of the semiconductor member).

In other words, layer region 5 having the microgaps constitutes a monolayer of the microgaps to thereby provide a gettering site having sufficiently high mechanical strength.

In this configuration according to the present embodiment, the gettering site is arranged away from semiconductor layer 4 to thereby protect the entire semiconductor layer 4 from contamination with metal impurities. This configuration is advantageously used for wafers for the manufacture of partially depleted insulated gate transistors as well as of fully depleted insulated gate transistors.

Figure 2:
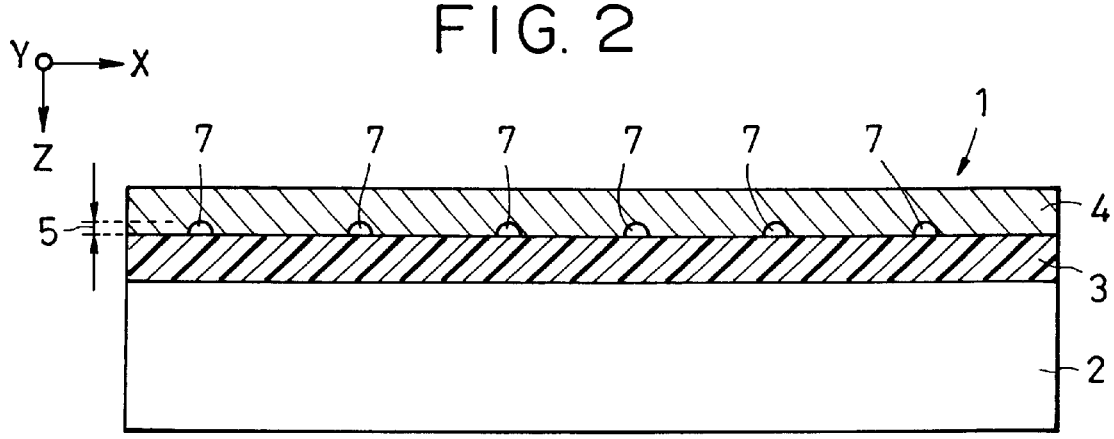
FIG. 2 is a schematic sectional view of a semiconductor member according to another embodiment of the present invention.

FIG. 2 is a schematic sectional view of a semiconductor member according to another embodiment of the present invention.

With reference to FIG. 2, the invented semiconductor member will be illustrated by taking an SOI substrate as example. SOI substrate 1 includes substrate 2, buried insulating layer 3 formed on substrate 2, and single-crystal semiconductor layer 4 formed on buried insulating layer 3. Substrate 2 is composed of, for example, a single-crystal semiconductor such as a silicon wafer, and semiconductor layer 4 is composed of, for example, single-crystal silicon.

Plural microgaps 7 are arranged along the upper interface of buried insulating layer 3. Most of plural microgaps 7 are dispersed and arranged in a plane in parallel with the surface of the semiconductor member, and microgaps 7 do not overlap one another in the depth direction Z.

In other words, layer region 5 having the microgaps constitutes a monolayer of the microgaps to thereby provide a gettering site having sufficiently high mechanical strength.

In this configuration, a gettering site is formed in semiconductor layer 4 but is formed on the lowermost side of semiconductor layer 4 to thereby protect the surface side of semiconductor layer 4, in which a semiconductor element is formed, from contamination with metal impurities.

This configuration according to the present embodiment is markedly effective to getter Fe and other metal impurities having a low diffusing rate in an oxide film when insulating layer 3 is a relatively thick insulating layer having a thickness of, for example, more than 1 μm.

The configuration is advantageously used for the manufacture of partially depleted transistors.

Figure 3:
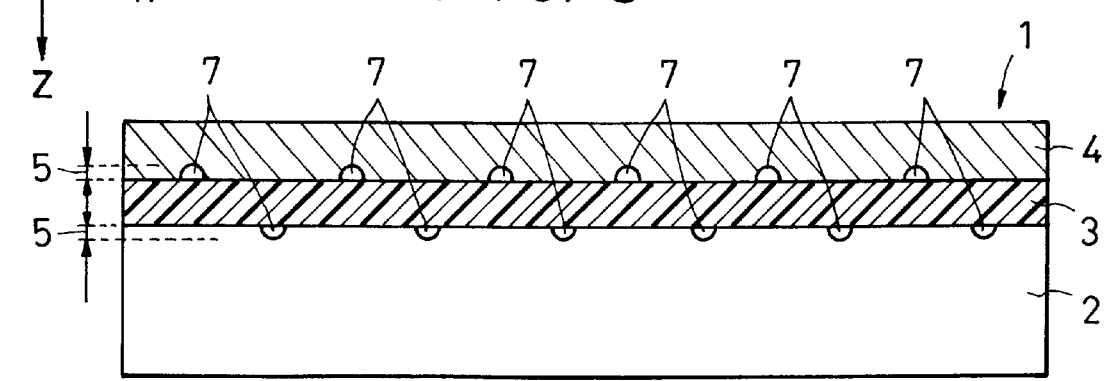
FIG. 3 is a schematic sectional view of a semiconductor member according to yet another embodiment of the resent invention.

FIG. 3 is a schematic sectional view of a semiconductor member according to yet another embodiment of the present invention.

The configuration according to the present embodiment is the combination of the configurations shown in FIGS. 1 and 2, and plural microgaps are arranged along the upper and lower interfaces of a buried insulating layer.

From a manufacturing viewpoint, the embodiments shown in FIGS. 1 and 2 can be manufactured at lower cost than the embodiment shown in FIG. 3.

The thickness of semiconductor layer 4 for advantageous use in the present invention is not specifically limited and can be selected, for example, within a range from about 10 nm to about 10 μm. Semiconductor layer 4 is not necessarily a single layer and may be a laminate of plural layers composed of different semiconductor materials, such as a combination of a silicon layer and a silicon-germanium layer. The laminate may have at least one hetero junction.

The thickness of insulating layer 3 for advantageous use in the present invention is not specifically limited and can be selected, for example, within a range from about 10 nm to about 10 μm.

The thickness of substrate 2 for advantageous use in the present invention is not specifically limited and can be selected, for example, within a range from about 10 μm to about 10 mm. The substrate is preferably a semiconductor substrate composed of single-crystal silicon, and the substrate may further have a polycrystalline silicon layer deposited on its surface according to necessity.

The microgaps for use in the present invention are distinguishable from voids having a diameter from about 1 mm to about 1 cm, which are formed in a bonding interface in case of insufficient bonding. The microgaps are much smaller in size than voids.

Figure 4:
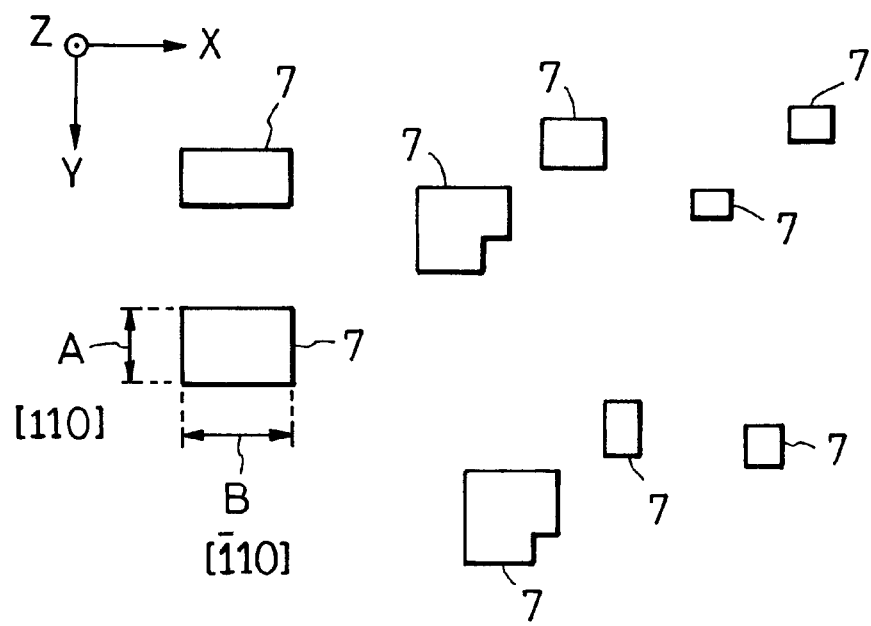
FIG. 4 is a schematic plan view of microgaps for use in the present invention.

FIG. 4 is a schematic plan view showing microgaps for use in the present invention, schematically showing the shapes of the microgaps on a plane (interface) on which the microgaps are formed. Preferably, the microgaps are each box-shaped (rectangular) having lengthwise side A 10 nm to 100 nm long and widthwise side B 10 nm to 100 nm long in the X-Y plane. Lengthwise side A and widthwise side B are preferably each substantially in parallel with the crystal orientations.

Figure 5:
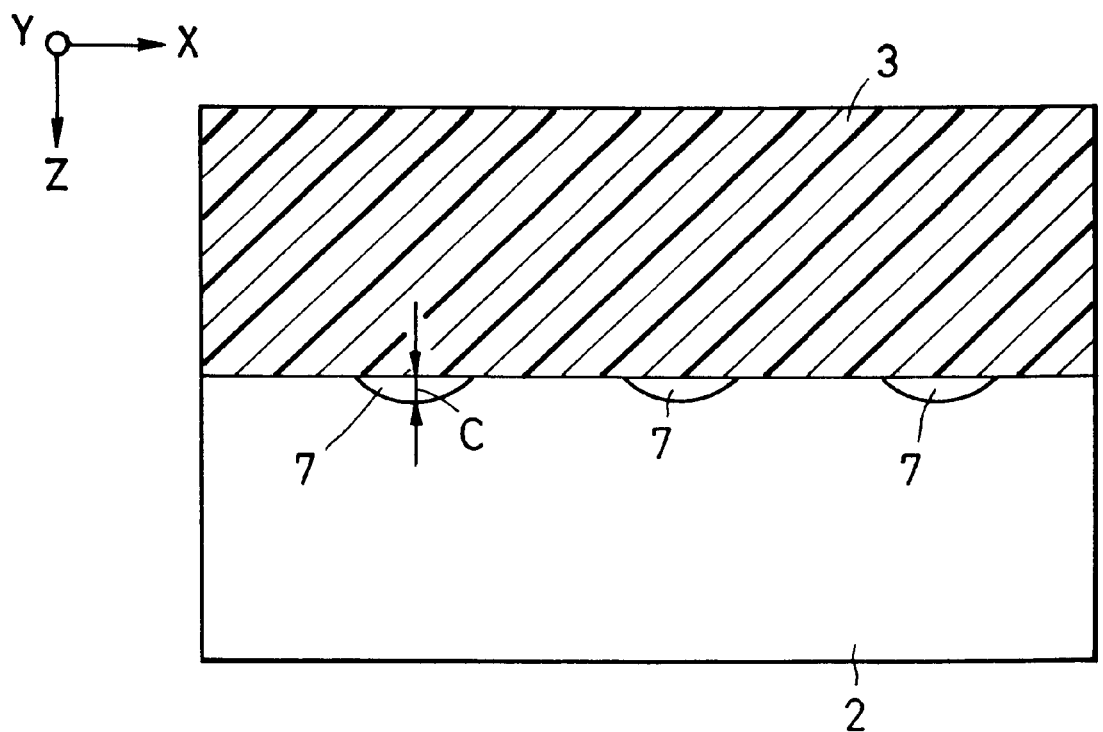
FIG. 5 is a schematic sectional view of the vicinity of a layer region including microgaps according to an embodiment of the present invention.

FIG. 5 is a schematic sectional view showing the microgaps for use in the present invention. The thickness (length) C of the microgap in the thickness direction of the layer region (the Z direction) is sufficiently shorter than the thickness of the single-crystal semiconductor layer or of the buried insulating layer and is equal to or less than 100 nm, and more preferably from 1 nm to 100 nm.

As thus described, the microgaps for use in the present invention are on the order of nanometers in size and can be referred to as "nanogaps".

The shapes of the microgaps are not limited to the box shape, and the microgaps may be in the form of a triangle, pentagon and other higher polygons, circle, ellipse, or irregular shape, as long as they have areas equivalent to that of the box.

A film such as an oxide film is preferably formed on the inner surfaces of the microgaps, and this configuration can further prevent thermal deformation or aggregation of microgaps.

The density of the microgaps in a certain plane, such as in the upper and lower interfaces of the buried insulating layer, is preferably in a range from $5 \times 10^9$ per square centimeter to $5 \times 10^{11}$ per square centimeter, in order to yield a predetermined gettering capability and to ensure sufficient mechanical strength in the plane.

Figure 6:
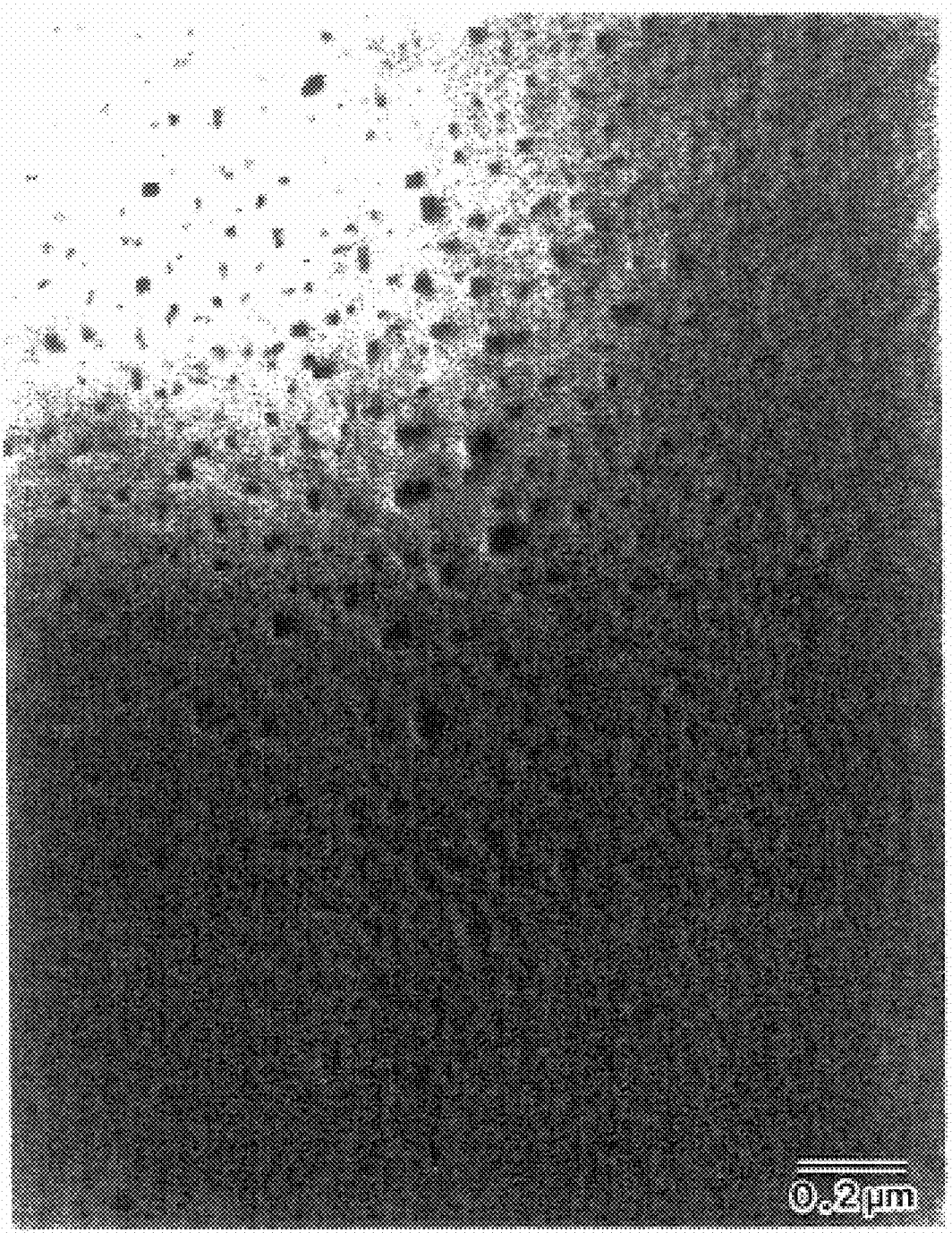
FIG. 6 is a diagram showing the transmission electron micrograph of microgaps for use in the present invention.
Figure 7:
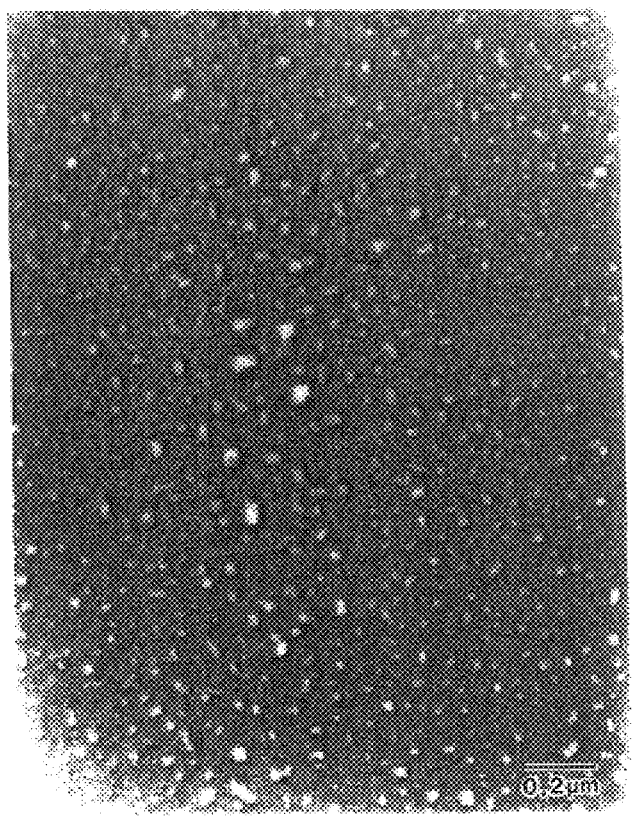
FIG. 7 is a diagram showing the transmission electron micrograph of microgaps for use in the present invention.

FIGS. 6 and 7 each show an example of microgaps for use in the present invention, in which FIG. 6 is a diagram showing a transmission electron microscopic dark-field image of an interface having microgaps, and FIG. 7 is a diagram showing a transmission electron microscopic bright-field image of an interface having microgaps. These two figures show that a multiplicity of rectangular microgaps are dispersed and arranged in the interface.

Figure 8:
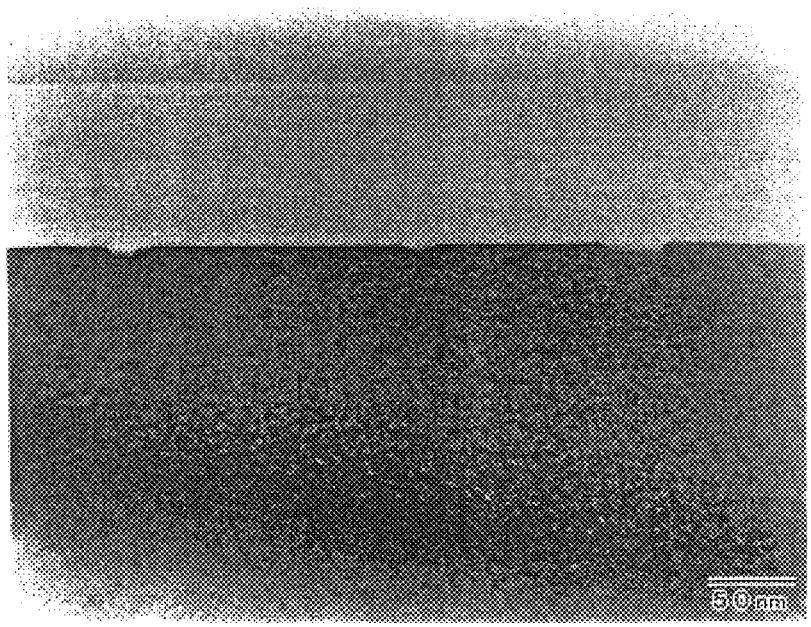
FIG. 8 is a diagram showing the transmission electron micrograph of microgaps for use in the present invention.

FIG. 8 shows another example of the microgaps for use in the present invention and is a transmission electron microscopic bright-field image thereof along the section of a semiconductor member. With reference to FIG. 8, three microgaps bent toward the semiconductor substrate side are arranged at intervals along an interface between an upper buried insulating layer and a lower semiconductor substrate.

Figure 9:
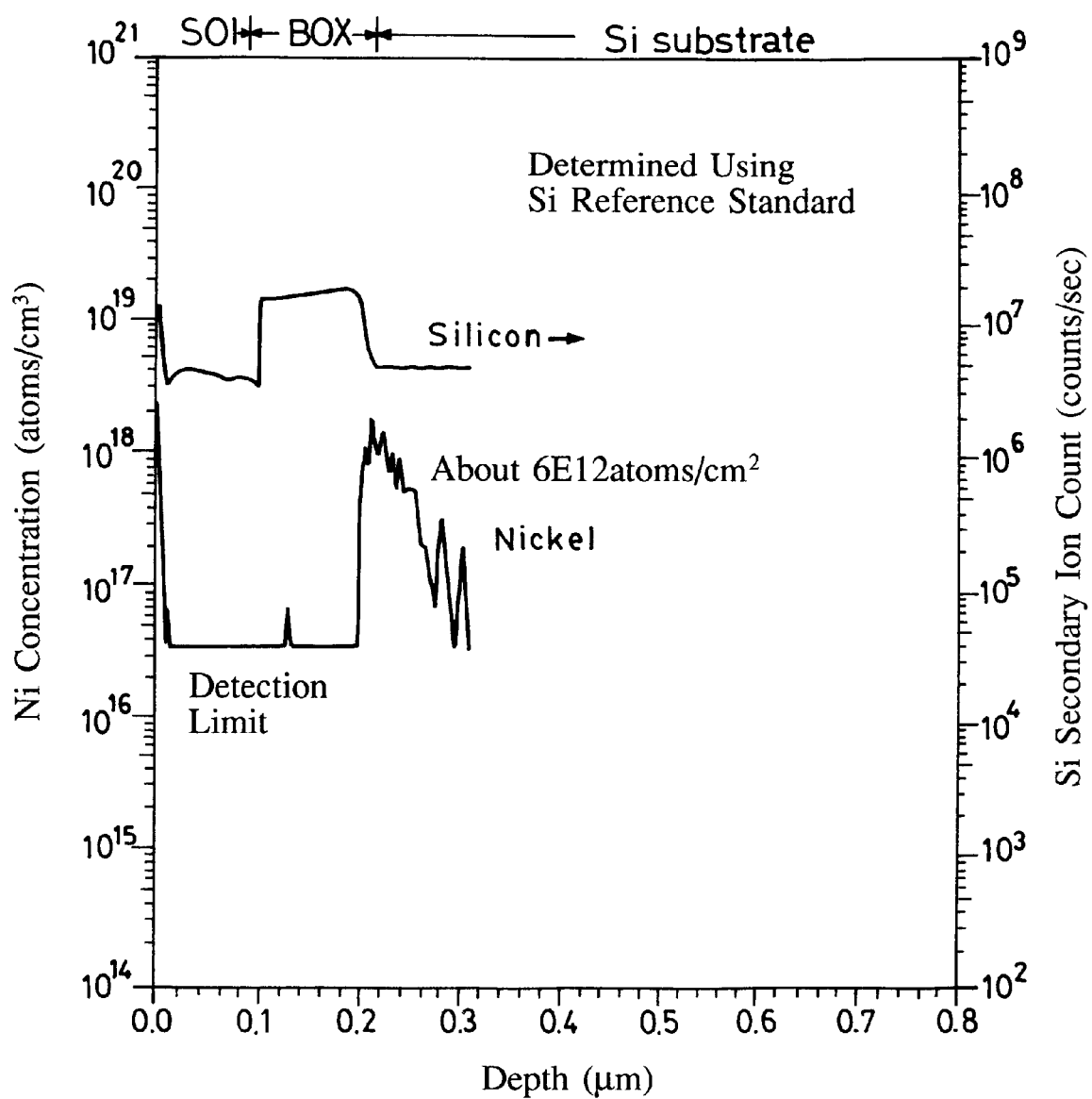
FIG. 9 is a graph showing gettering of metal impurities by an invented sample.

A semiconductor member according to the present invention, and one having no microgaps as a comparative example were prepared. The surface of each semiconductor member was forcedly contaminated with Ni at a density of $6\times10^{10}$ atoms per square centimeter by the microdrop method, and each semiconductor member was then subjected to a heat treatment at 1050° C. in a nitrogen atmosphere for three hours. FIG. 9 (the invented example) and FIG. 10 (the comparative example) each show the distribution of atoms in the depth direction (thickness direction) from the surface of the semiconductor member. Such distributions can be observed and verified by secondary ion mass spectrometry (SIMS).

Generally in the SIMS analysis shows that the generation rate of secondary ion increases in an insulative substance, therefore a region, in which the silicon (Si) concentration is locally increased, addresses a silicon oxide layer serving as a buried insulating layer.

In the invented example shown in FIG. 9, Ni was satisfactorily captured by a layer region in the vicinity of the lower interface of the buried insulating layer having microgaps arranged therein, and Ni was detected ten times as much as that in the comparative example shown in FIG. 10, and the distribution of the peak of Ni in the surface side became narrow. The Ni concentration (the integral of peak Ni concentrations) in the vicinity of the interface having microgaps (in a region having a depth from about 0.2 μm to about 0.3 μm) was $6\times10^{12}$ atoms per square centimeter. In the comparative example having no microgap, the Ni concentration was $5\times10^{11}$ atoms per square centimeter.

Fe instead of Ni was diffused in the same manner as above, and the distribution of Fe was determined by SIMS to thereby find that Fe was detected in the invented example about two times as much as that in the comparative example, in a layer region in the vicinity of the lower interface of the buried insulating layer having microgaps arranged therein.

Cu instead of Ni was diffused in the same manner as above, and the distribution of Cu was determined by SIMS to thereby find that Cu was detected in the invented example about 3.5 times as much as that in the comparative example, in a layer region in the vicinity of the lower interface of the buried insulating layer having microgaps arranged therein.

In particular, when the microgaps are formed in the vicinity of the lower interface of the buried insulating layer, Cu can be satisfactorily captured by a heat treatment at low temperatures of about 700° C. for about one hour. Fe and Ni are less prone to pass through the buried insulating layer, and the device is preferably subjected to a heat treatment at about 1000° C. for about one hour for gettering Fe and Ni.

When the microgaps are formed in the vicinity of the upper interface of the buried insulating layer, each of Cu, Fe and Ni can be captured by a heat treatment at low temperatures of about 700° C. for about 1 hour.

If the semiconductor member is shipped, for example, as an SOI wafer, the Ni concentration captured in a monolayer region having microgaps preferably does not exceed $5\times10^{10}$ per square centimeter, and the Cu concentration preferably does not exceed $1\times10^{11}$ per square centimeter.

Manufacturing Method of Semiconductor Member

A method for manufacturing a semiconductor member according to an embodiment of the present invention will be described in detail below.

Figure 11A:
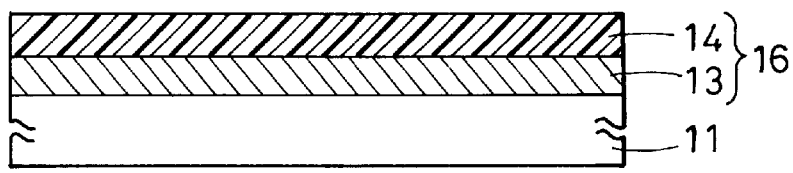
FIGS. 11A to 11D are schematic sectional views showing a method for manufacturing a semiconductor member according to an embodiment of the present invention.
Figure 11B:

Initially, first substrate 11 shown in FIG. 11A having transfer layer region 16 including semiconductor layer 13 and insulating layer 14 and second substrate 15 shown in FIG. 11B are respectively prepared.

Figure 11C:
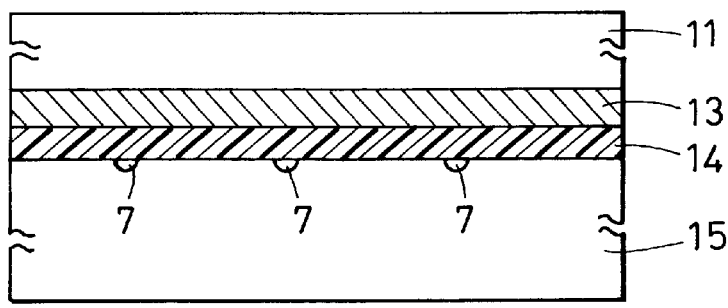
Figure 11D:
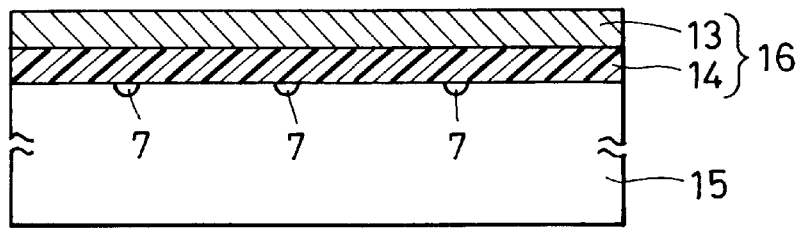

Next, transfer layer region 16 is transferred to second substrate 15 in a transferring step shown in FIGS. 11C and 11D.

With reference to FIG. 11C, first substrate 11 is bonded with second substrate 15 in such a manner that plural microgaps 7 are sandwiched between these two substrates. In this procedure, second substrate 15 is preferably free from an insulating layer on its surface. By this configuration, microgaps are arranged along an interface between second substrate 15 to be a semiconductor substrate and insulating layer 14, as in the structure shown in FIG. 1.

Alternatively, insulating layer 14 is not formed on the surface of semiconductor layer 13 but on the surface of second substrate 15. By this configuration, microgaps are arranged along an interface between the semiconductor layer and the insulating layer, as in the structure shown in FIG. 2.

To form microgaps 7, the bonding procedure should preferably be performed under bonding conditions such that the surfaces to be bonded (bonding surfaces) are smoothed to such a degree that some microroughness remains, that the substrates are cleaned with a hydrophobic cleaning solution so as to make the bonding surfaces hydrophobic, that a heat treatment for bend strengthening is performed at temperatures in a range from 900° C. to 1200° C., and that the early stage of growth of semiconductor layer 13 is performed at temperatures in a range from 900° C. to 1100° C. These conditions may be appropriately combined.

With reference to FIG. 11D, an unnecessary portion, that is, first substrate 11 other than transfer layer region 16 is removed from the resulting multilayer structure formed by bonding the first substrate and second substrate. The unnecessary portion is preferably removed by at least one technique selected from among grinding from the back, lapping, polishing, and etching. Alternatively, the unnecessary portion may be separated from transfer layer region 16 at the bottom of transfer layer region 16. Such separation techniques include, for example, a technique in which a solid wedge is inserted into the side of the multilayer structure and a force is applied to thereby separate the first and second substrates from each other; a technique in which heat sufficient to separate the multilayer structure is applied to the multilayer structure; a technique in which an ultrasonic vibration is applied to the multilayer structure; and a technique in which a liquid wedge is inserted into the side of the multilayer structure and a force is applied to thereby separate the first and second substrates from each other.

If a newly exposed surface of a semiconductor layer is rough, the surface of the semiconductor layer is smoothed by polishing or by a heat treatment in a hydrogen-containing reducing atmosphere (hydrogen annealing). When the surface is subjected to hydrogen annealing after or without polishing, even if metal impurities are trapped inside the semiconductor member during hydrogen annealing, the metal impurities are captured or gettered by the microgaps.

FIGS. 12A to 12E show a method for manufacturing a semiconductor member according to another embodiment of the present invention.

Figure 12A:
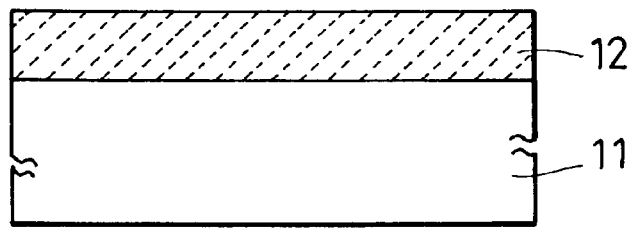
FIGS. 12A to 12E are schematic sectional views showing a method for manufacturing a semiconductor member according to another embodiment of the present invention.

With reference to FIG. 12A, porous layer 12 is formed on the surface of first substrate 11 by a technique such as anodization. Porous layer 12 is composed of, for example, porous single-crystal silicon, and first substrate 11 is composed of a semiconductor such as silicon. Porous layer 12 may be a single-layer structure or a multilayer structure composed of plural porous layers having different porosities from each other. In the latter structure, it is preferred that a porous layer formed on the surface side has a relatively low porosity and a porous layer formed therebelow has a relatively high porosity. According to necessity, porous layer 12 is subjected to a heat treatment at about 400° C. in an oxidizing atmosphere to thereby form a film of, for example, silicon oxide on the inner walls of pores of porous layer 12. Where necessary, porous layer 12 having the films is then impregnated in, for example, a dilute hydrofluoric acid to thereby remove the film on the layer surface of porous layer 12.

Figure 12B:
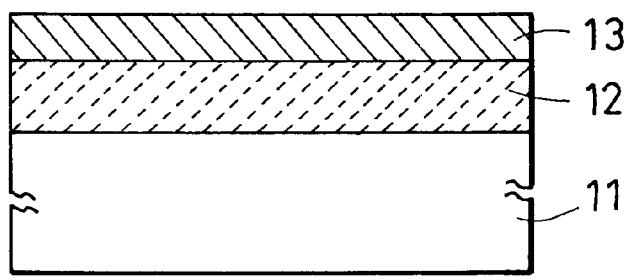

With reference to FIG. 12B, semiconductor layer 13 composed of, for example, non-porous single-crystal silicon is formed on porous layer 12. According to necessity, at least some of the pores on the layer surface of porous layer 12 are preferably filled or sealed by a heat treatment in a hydrogen-containing atmosphere (hydrogen baking) prior to the formation of semiconductor layer 13. It is also preferred that a small amount of a silicon-containing gas is supplied after the beginning of hydrogen baking to thereby enhance the sealing of pores on the surface, and hydrogen baking is then again performed, and a larger amount of the silicon-containing gas is further supplied to enhance the growth of semiconductor layer 13. The temperature in this procedure is preferably from about 900° C. to about 1100° C.

Figure 12C:
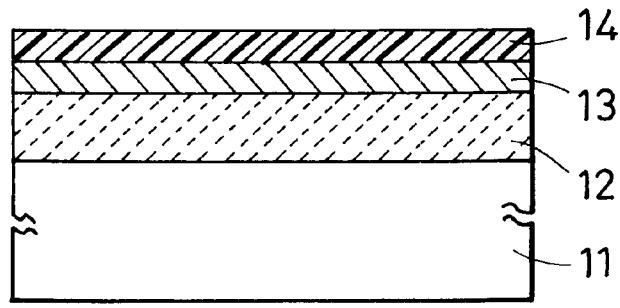

With reference to FIG. 12C, insulating layer 14 is formed on semiconductor layer 13 by thermal oxidation or chemical vapor deposition (CVD).

To make at least the surface composed of silicon of the second substrate hydrophobic, the substrate is cleaned with an aqueous solution containing hydrogen fluoride and is rinsed with pure water and is then dried.

Figure 12D:
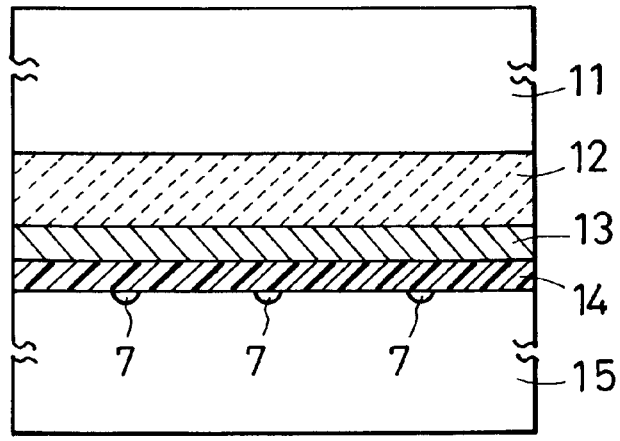

With reference to FIG. 12D, second substrate 15 composed of, for example, silicon, is separately prepared and is bonded with the first substrate 11 in the air, and the resulting bonded structure is subjected to a heat treatment for bonding at temperatures from 900° C. to 1200° C. in an oxidizing atmosphere. Thus, a multilayer structure is prepared.

Figure 12E:
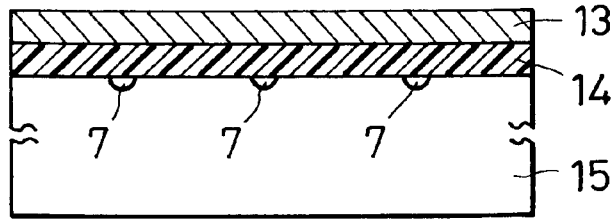

With reference to FIG. 12E, the non-porous portion of first substrate 11 is removed by a technique such as grinding, lapping, polishing or etching, and thus-exposed porous layer 12 is removed by, for example, etching. Alternatively, the inside or the upper or lower interface of porous layer 12 is cracked by the aforementioned technique to thereby separate first substrate 11 from semiconductor layer 13. Porous layer 12 constitutes a boundary between these two layers in this separation. If the porous layer remains on semiconductor layer 13, it may be removed by etching.

Thus, semiconductor layer 13 is transferred from first substrate 11 to second substrate 15 to thereby yield an SOI substrate.

When the newly exposed surface of semiconductor layer 13 is rough, the surface of semiconductor layer 13 is smoothed by, for example, polishing or hydrogen annealing.

Subsequently, a compound semiconductor layer, not shown in the figures, composed of a compound such as SiGe, GaAs or InPn may be formed on semiconductor layer 13 by hetero-epitaxial growth.

FIGS. 13A to 13E show a method for manufacturing a semiconductor member according to yet another embodiment of the present invention.

Figure 13A:
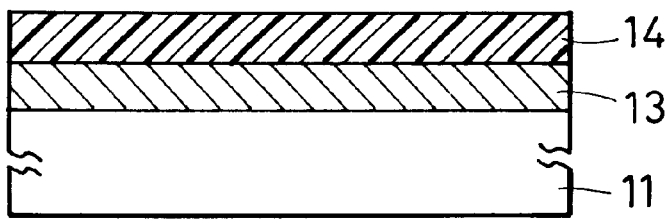
FIGS. 13A to 13E are schematic sectional views showing a method for manufacturing a semiconductor member according to still another embodiment of the present invention.

With reference to FIG. 13A, single-crystal semiconductor layer 13 is formed, according to necessity, on the surface of first substrate 11 composed of a semiconductor such as silicon by epitaxial growth, and insulating layer 14 composed of, for example, silicon oxide, is formed thereon by a technique such as thermal oxidation.

Figure 13B:
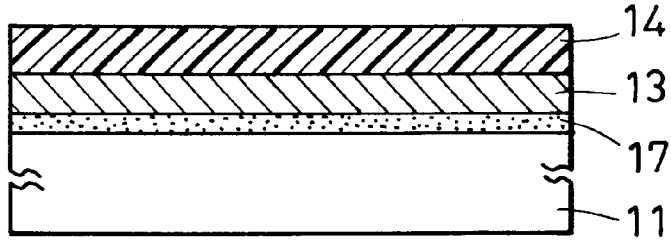

With reference to FIG. 13B, at least one ion 18 selected from hydrogen and rare gases is implanted through insulating layer 14 into first substrate 11 to thereby form ion implantation layer 17 in the vicinity of the bottom of semiconductor layer 13. Ion implantation layer 17 serves as a separation layer afterward. The term "ion implantation layer" as used herein means a layer region having an implanted ion concentration relatively higher than a certain level, and there is no clear upper and lower interfaces thereof.

Separately, second substrate 15 composed of silicon is prepared, and at least the surface composed of silicon of second substrate 15 is cleaned with an aqueous solution containing hydrogen fluoride, is rinsed with pure water, and is dried to thereby yield a hydrophobic surface.

Figure 13C:
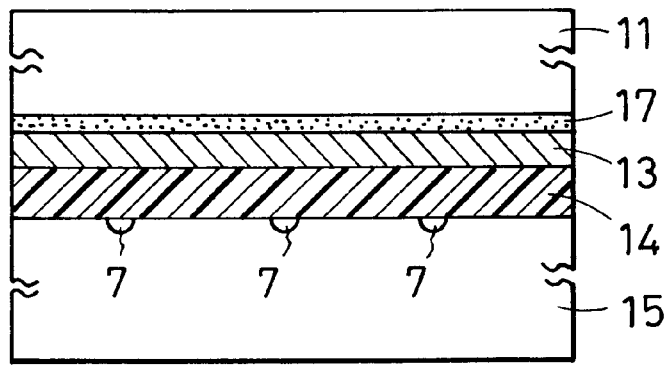

With reference to FIG. 13C, second substrate 15 is brought into close contact with first substrate 11 with the interposition of insulating layer 14 in the air to thereby yield a multilayer structure.

Figure 13D:
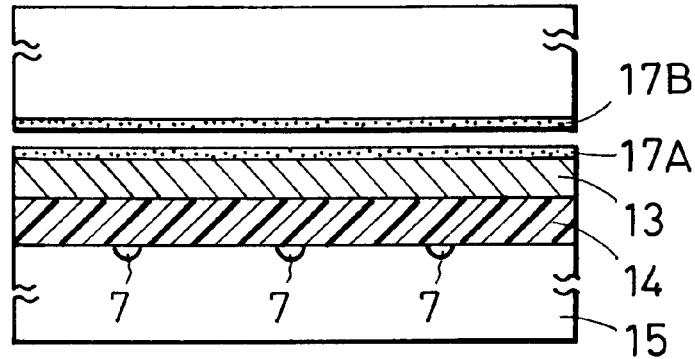

With reference to FIG. 13D, the multilayer structure is then subjected to a heat treatment for bonding at from about 500° C. to about 800° C. in an oxidizing atmosphere for about 5 minutes to about 30 minutes to thereby form microcavities in ion implantation layer 17. Ion implantation layer 17 is then deformed and is cracked to thereby separate the multilayer structure into two segments. After separation, a segment including second substrate 15 is further subjected to a heat treatment at 900° C. to 1200° C. in an oxygen- or nitrogen-containing atmosphere for 30 minutes to 120 minutes, thus improving the bonding strength between insulating layer 14 and second substrate 15. In this procedure, the microgaps are arranged on the semiconductor side of the bonding interface.

Semiconductor layer 13 is thus transferred from first substrate 11 onto second substrate 15 to thereby yield an SOI substrate.

On the newly exposed surface of semiconductor layer 13, layer region 17A that has been damaged by ion implantation remains, and the surface thereof is rough. Accordingly, the surface is subjected to etching, polishing or hydrogen annealing according to necessity. Etching and polishing can remove the damaged layer region, and polishing and hydrogen annealing can smooth the surface of the semiconductor layer.

Figure 13E:
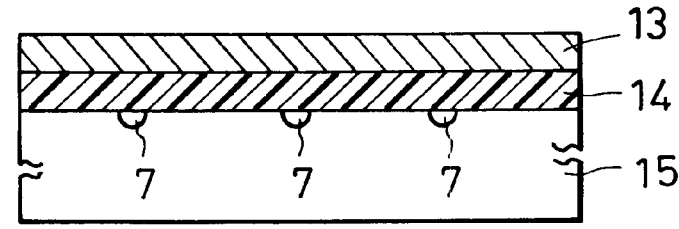

With reference to FIG. 13E, an SOI substrate having a smooth surface is obtained.

FIGS. 14A to 14E show a method for manufacturing a semiconductor member according to still another embodiment of the present invention.

Figure 14A:
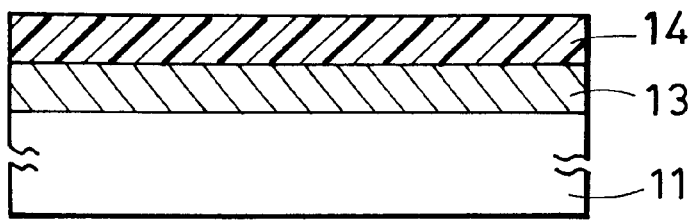
FIGS. 14A to 14E are schematic sectional views showing a method for manufacturing a semiconductor member according to a further embodiment of the present invention.

With reference to FIG. 14A, single-crystal semiconductor layer 13 is formed, according to necessity, on the surface of first substrate 11 composed of a semiconductor such as silicon by epitaxial growth, and insulating layer 14 composed of, for example, silicon oxide is formed thereon by a technique such as thermal oxidation.

Figure 14B:
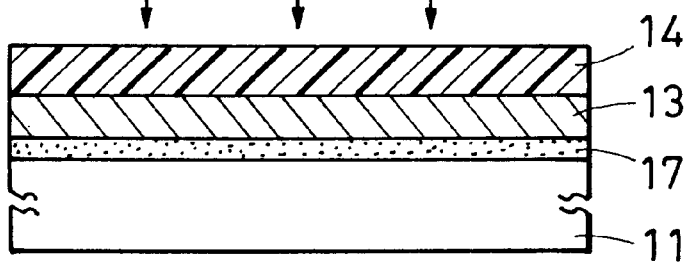

With reference to FIG. 14B, at least one ion 18 selected from hydrogen or rare gases is implanted through insulating layer 14 into first substrate 11 at a low dose to thereby form low-concentration ion implantation layer 17 in the vicinity of the bottom of semiconductor layer 13. Thus-formed ion implantation layer 17 serves as a separation layer.

Separately, second substrate 15 composed of silicon is prepared, and at least the surface composed of silicon of second substrate 15 is cleaned with an aqueous solution containing hydrogen fluoride, is rinsed with pure water and is dried to yield a hydrophobic surface.

Figure 14C:
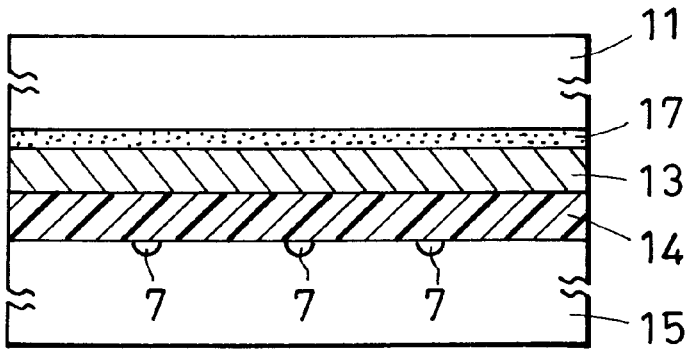

With reference to FIG. 14C, second substrate 15 is bonded with first substrate 11 with the interposition of insulating layer 14 in the air to thereby yield a multilayer structure.

The multilayer structure is then subjected to a heat treatment for bonding at from about 500° C. to about 800° C. in an oxidizing atmosphere for about 5 minutes to about 30 minutes. If microcavities are formed in ion implantation layer 17, ion implantation layer 17 does not cracked, since the dose of implanted ion in the prior step is set at a low level.

Figure 14D:
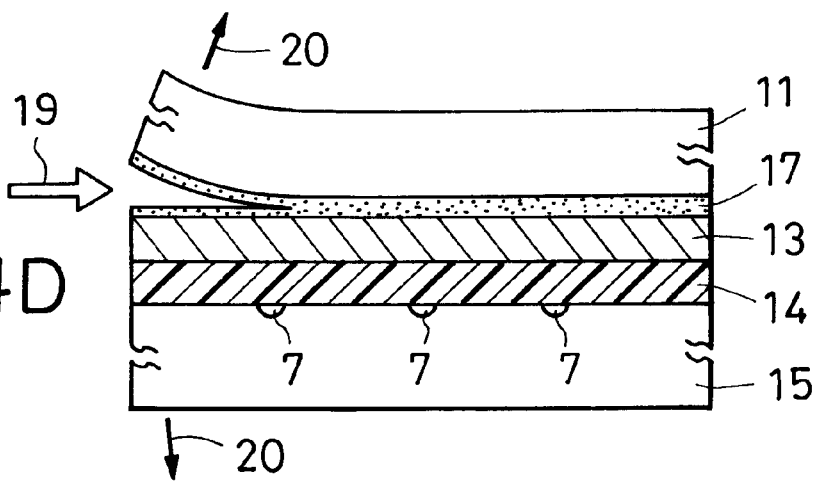

With reference to FIG. 14D, external force 19 is applied to the side of the multilayer structure, for example, by insertion of a solid or liquid wedge. This external force serves to apply a force in direction 20 so as to peel first and second substrates 11 and 15 from each other. Thus, a crack is formed in ion implantation layer 17 in the vicinity of the substrate and is propagated to thereby separate semiconductor layer 13 from first substrate 11.

Figure 14E:
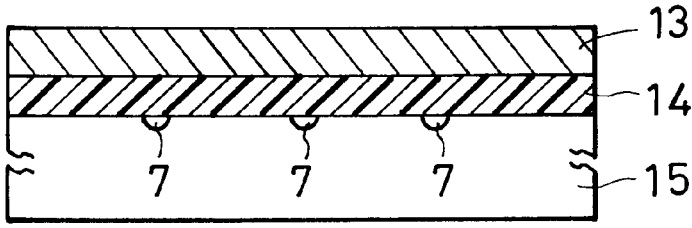

With reference to FIG. 14E, semiconductor layer 13 is transferred from first substrate 11 onto second substrate 15 to thereby yield an SOI substrate.

When a layer region damaged by ion implantation remains on the newly exposed surface of the semiconductor layer or the surface is roughened by cracking, the surface is subjected to etching, polishing or hydrogen annealing according to necessity. Etching and polishing can remove the damaged layer region, and polishing and hydrogen annealing can smooth the surface of the semiconductor layer.

Techniques for the formation of microgaps for use in the present invention include, for example, a technique in which a low energy low dose ion is implanted into the bonding surface of a semiconductor substrate composed of single-crystal silicon or polycrystalline silicon to thereby form a monolayer of microgaps or microscopic projections and depressions to constitute a monolayer of microgaps before bonding; and a technique in which microscopic projections and depressions to constitute microgaps are formed on the surface by another technique such as etching before bonding, in addition to the aforementioned techniques.

Semiconductor Device and Manufacturing Method Thereof

A method for manufacturing a semiconductor device according to the present invention will be illustrated with reference to FIGS. 15A to 15D.

FIGS. 15A to 15D are diagrams showing a method for manufacturing a semiconductor device according to a preferred embodiment of the present invention.

Initially, a semiconductor member as shown in any of FIGS. 1 to 3 is prepared.

Figure 15A:
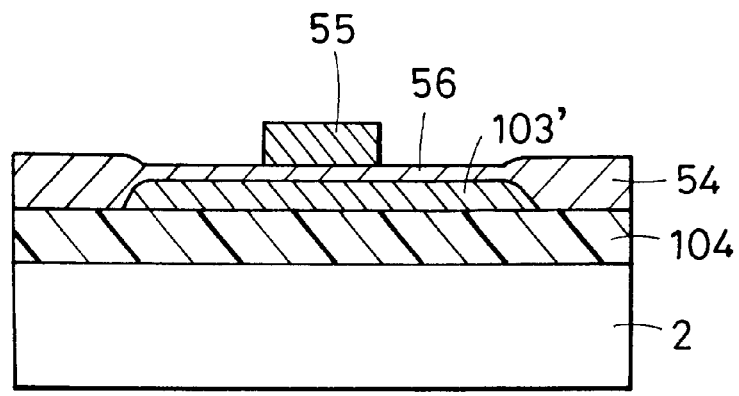
FIGS. 15A to 15D are schematic sectional views showing a method for manufacturing a semiconductor device according to an embodiment of the present invention.

With reference to FIG. 15A, active region 103', on which a transistor is formed, and element separation region 54 are formed by, for example, a technique in which non-porous semiconductor layer (SOI layer) 103 on buried insulating layer 104 is patterned in the form of islands or by an oxidation technique called local oxidation of silicon (LOCOS).

Next, gate insulating film 56 is formed on the surface of the SOI layer (FIG. 15A). Materials for gate insulating film 56 include, for example, silicon oxide, silicon nitride, silicon oxide nitride, aluminum oxide, tantalum oxide, hafnium oxide, titanium oxide, scandium oxide, yttrium oxide, gadolinium oxide, lanthanum oxide, zirconium oxide, and mixture glasses of these substances. Gate insulating film 56 is formed, for example, by oxidation of the surface of the SOI layer or deposition of a corresponding substance on the surface of the SOI layer by chemical vapor deposition (CVD) or physical vapor deposition (PVD).

Gate electrode 55 is then formed on gate insulating film 56 (FIG. 15A). Gate electrode 55 is composed of, for example, polycrystalline silicon doped with a p-type or n-type impurity: tungsten, molybdenum, titanium, tantalum, aluminum, copper, and other metals, or alloys each containing at least one of these metals; molybdenum silicide, tungsten silicide, cobalt silicide, and other metallic suicides; and titanium nitride, tungsten nitride, tantalum nitride, and other metallic nitrides. Gate electrode 55 may be formed by the lamination of plural layers composed of different materials, such as in a polycide gate. Gate electrode 55 may be formed by self-aligned silicide process ("SALICIDE"), "damascene gate process", or other techniques. Thus, a structure as shown in FIG. 15A is obtained.

Figure 15B:
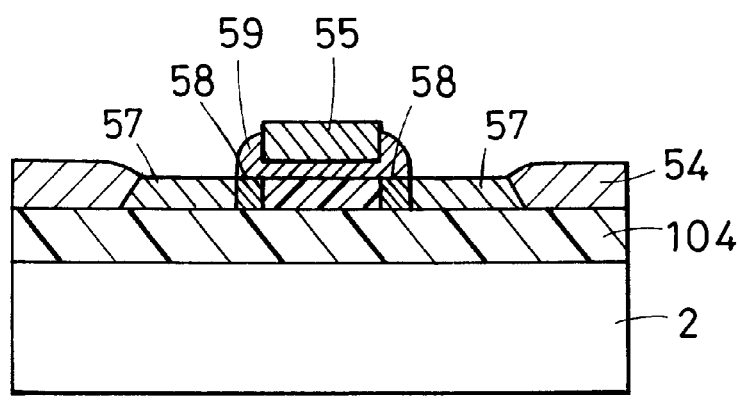

Subsequently, an n-type impurity such as phosphorus, arsenic or antimony or a p-type impurity such as boron is introduced into active region 103' to thereby form source and drain regions 58 having a relatively low concentration (FIG. 15B). The impurity can be introduced, for example, by ion implantation and heat treatment.

Next, an insulating film is formed so as to cover gate electrode 55 and is then etchbacked to thereby form side wall 59 on the side of gate electrode 55.

An impurity of the same conduction type as above is then introduced into active region 103' to thereby form source and drain regions 57 having a relatively high concentration. Thus, a structure shown in FIG. 15B is obtained.

Figure 15C:
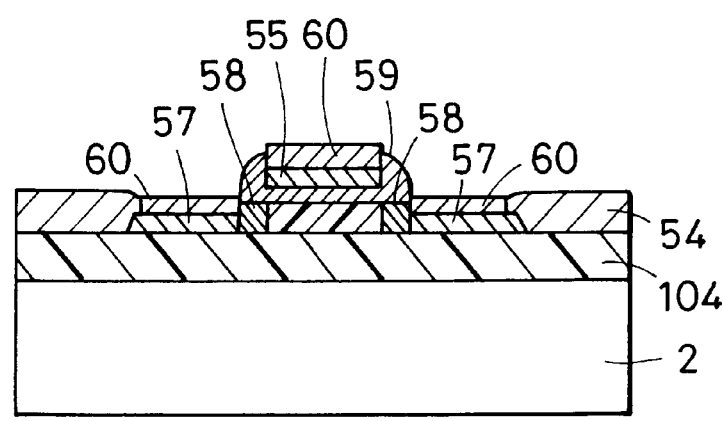

Next, metallic silicide layer 60 is formed on the top faces of gate electrode 55 and of source and drain regions 57. Preferred materials for the metallic silicide layer 60 are, for example, nickel silicide, titanium silicide, cobalt silicide, molybdenum silicide, and tungsten silicide. Each of these silicides can be formed by depositing a corresponding metal so as to cover the top face of gate electrode 55 and of source and drain regions 57 and allowing the deposited metal to react with silicon therebelow by a heat treatment, and removing an unreacted portion of the metal with an etchant such as sulfuric acid. According to necessity, the surface of the resulting silicide layer may be nitrided. Thus, a structure shown in FIG. 15C is obtained.

Figure 15D:
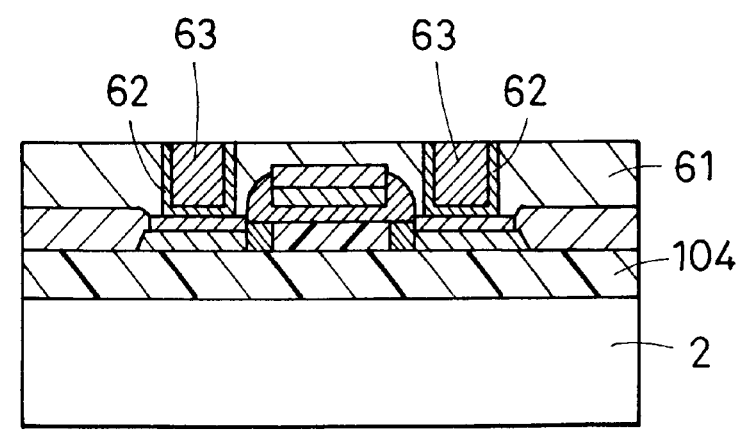
Figure 16:
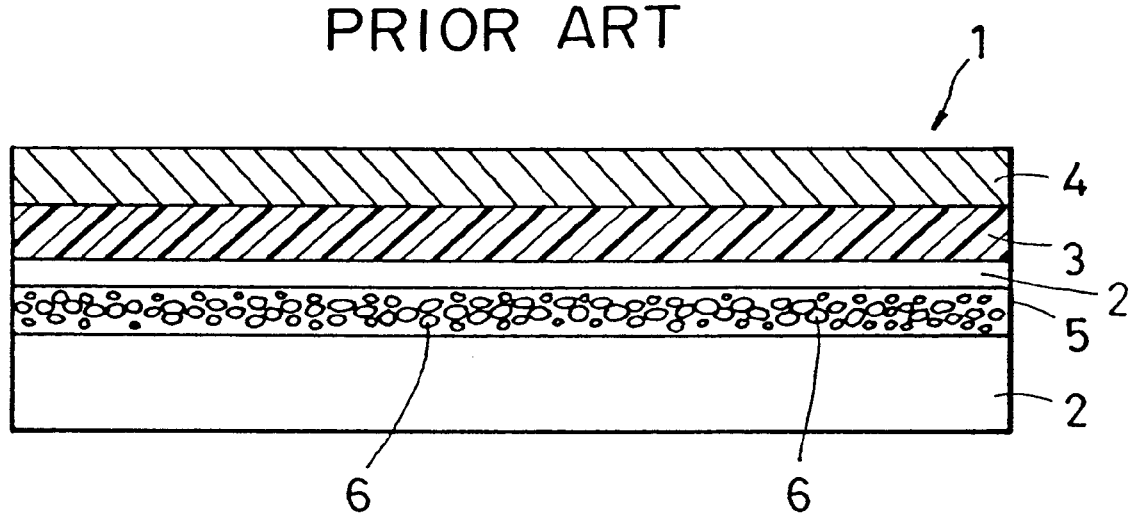
FIG. 16 is a schematic sectional view of a conventional semiconductor member.
Figure 17:
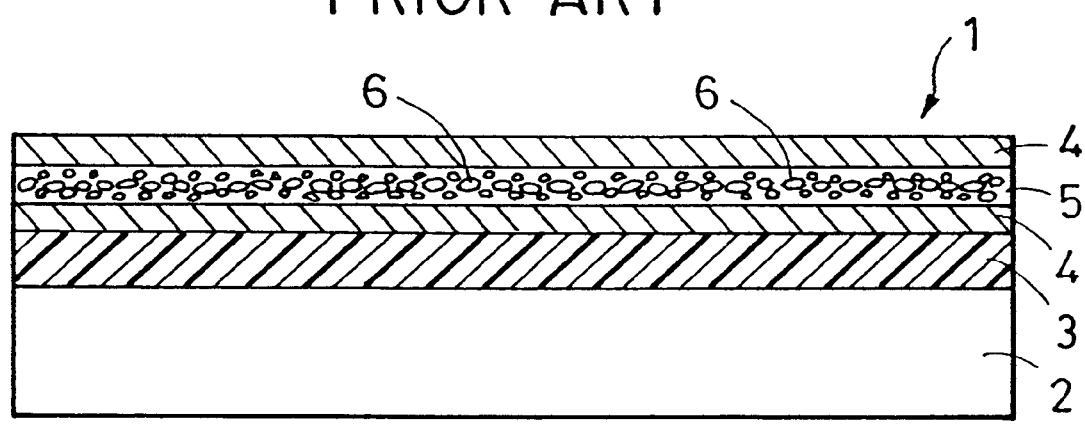
FIG. 17 is a schematic sectional view of another conventional semiconductor member.

Insulating film 61 is then formed so as to cover the top faces of the silicided gate electrode 55 and of the source and drain regions 57 (FIG. 15D). A preferred material for insulating film 61 is, for example, silicon oxide containing phosphorus and/or boron.

Next, the surface of insulating film 61 is smoothed by chemical mechanical polishing (CMP) according to necessity, and contact holes are formed thereon. Rectangular contact holes having a side of less than 0.25 $\mu$m or round contact holes having a diameter less than 0.25 $\mu$m can be formed by the photolithographic technique using KrF excimer laser, ArF excimer laser, $F_2$ excimer layer, electron beams, or x-rays.

Subsequently, a conductor is charged into the contact holes. The conductor is preferably charged by a process in which a film of a refractory metal or its nitride to constitute barrier metal 62 is formed on the inner surfaces of the contact holes, and conductor 63 is then deposited thereon by CVD, PVD or plating. Such conductors include tungsten alloys, aluminum, aluminum alloys, copper, and copper alloys. In this procedure, the conductor deposited higher than the top face level of insulating film 61 may be removed by etchback or CMP. Additionally, the surface of the silicide layer of the source and drain regions exposed to the bottom of the contact hole may be nitrided, prior to the charging of the conductor. These steps can form a transistor such as a field-effect transistor (FET) on the SOI layer to thereby yield a semiconductor device having a transistor of the configuration shown in FIG. 15D.

By determining the thickness and the impurity concentration of active layer (SOI layer) 103' so that a depleted layer under the gate insulating film reaches the top face of buried insulating layer 104 when a voltage is applied to the gate electrode, the formed transistor acts as a fully depleted transistor. Alternatively, by determining the thickness and the impurity concentration of active layer (SOI layer) 103' so that the depleted layer under the gate insulating film does not reach the top face of buried insulating layer 104, the formed transistor acts as a partially depleted transistor.

According to the present invention, a heat treatment is performed during or after the aforementioned process to thereby getter or capture metal impurities by the microgaps.

EXAMPLE 1

A series of first substrates each composed of an 8-inch Si (100) p+-type semiconductor wafer having a resistivity of 0.015 Ωcm and a thickness of 725 µm was prepared. Each of these substrates 11 was cleaned, and pores were formed in a region 13 µm deep from the surface layer by anodization to thereby form porous layer 12, as shown in FIG. 12A. Conditions for the formation of the porous layer were as follows:

Anodization solution: HF (35% by weight) aqueous solution; $C_2H_5OH$ (10% by weight) aqueous solution Anodization time: eleven minutes Anodization current: 8.15 mAcm$^2$ Next, the substrates were subjected to thermal oxidation at 400° C. for 60 minutes to thereby form an ultrathin thermal oxide film on the inner walls of the pores. This procedure was performed to prevent etching selectivity from deterioration due to structural change of the pores of the porous layer by a subsequent heat treatment.

The oxide film on the layer surface of the porous layer was removed with a dilute hydrofluoric acid, and each of the first substrates was placed in an epitaxial growth system. While supplying hydrogen gas into the epitaxial growth system, the temperature was raised to about 900° C.

Next, single-crystal semiconductor layer 13 having a thickness of 174 nm was formed by epitaxial growth, as shown in FIG. 12B.

Evaluation 1

One sample was selected from among the series of the above-processed samples, and the concentrations of heavy metal elements in single-crystal semiconductor layer 13 in the sample were determined by inductively coupled plasma-mass spectrometry (ICP-MS). The results are shown in Table 1. Table 1 shows the results of quantitative analyses of metal impurities in the film obtained by epitaxial growth in the manufacturing process of bonded SOI wafer according to the present invention.

TABLE 1

| Unit: ×10$^{10}$ (atoms/cm$^2$) | | | |
|---|---|---|---|
| Cr | Fe | Ni | Cu |
| <0.5 | <0.5 | <0.5 | <0.5 |

The concentrations of all the measured heavy metal elements, Cr, Fe, Ni and Cu, were less than 5×10$^9$ atoms per square centimeter. These concentration levels are equivalent to the surface metal contamination levels required of the starting materials in 2005, as specified by the roadmap of International Technology Roadmap for Semiconductors (ITRS), indicating that the inside of single-crystal semiconductor layer 13 is very clean and substatially free from contamination with heavy metal elements.

Next, insulating layer 14 having a thickness of 109 nm was formed on single-crystal semiconductor layer 13 of each of the remainder samples by wet oxidation at 1000° C. for 12 minutes 45 seconds. The resulting semiconductor substrate was cleaned to thereby form a three-layer structure composed of insulating layer 14 (thickness: 100 nm), single-crystal semiconductor layer 13 (thickness: 108 nm), and porous layer 12 (thickness: 13 µm), as shown in FIG. 12C.

Evaluation 2

One sample was selected from among the series of the samples after the cleaning procedure of the substrate shown in FIG. 12C, and the concentrations of heavy metal elements contained in insulating layer 14 were determined by ICP-MS. The results are shown in Table 2. Table 2 shows the results of quantitative analyses of metal impurities in the thermal insulating layer in the manufacturing process of bonded SOI wafer according to the present invention.

TABLE 2

| Unit: ×10$^{10}$ (atoms/cm$^2$) | | | |
|---|---|---|---|
| Cr | Fe | Ni | Cu |
| <0.5 | <0.5 | <0.5 | <0.5 |

The concentrations of all the measured heavy metal elements, Cr, Fe, Ni and Cu, were less than 5×10$^9$ atoms per square centimeter, indicating that insulating layer 14 was very clean and substantially free from contamination with heavy metal elements.

Next, an Si (100) 8-inch Si wafer having a resistivity of 10 to 20 Ωcm and a thickness of 725 µm was prepared as a second semiconductor substrate.

With reference to FIG. 12D, second semiconductor substrate 15 was prepared and was bonded with first semiconductor substrate 11 having the three-layer structure shown in FIG. 12C in the air in a Class 1 clean room.

Immediately before bonding, the surface of first semiconductor substrate 11 having the three-layer structure shown in FIG. 12C and the surface of second semiconductor substrate 15 were cleaned with a hydrophobic cleaning solution. Specifically, hydrophobic surfaces can be obtained by cleaning the substrates with dilute HF (the cleaned substrates may be rinsed with pure water thereafter) as the final step of a cleaning procedure prior to bonding.

To improve bonding strength while maintaining the structure shown in FIG. 12D, the bonded structure was subjected to "annealing oxidation" at 1100° C. in a nitrogen-oxygen gaseous mixture for 60 minutes as a heat treatment for bonding.

After annealing, the structure of FIG. 12D was mechanically ground from the back of first semiconductor substrate 11. The grinding procedure was continued until the back of porous layer 12 was exposed, and porous layer 12 was then etched with an etchant as a mixture of an aqueous 0.6% by weight HF solution and an aqueous 6.0% by weight hydrogen peroxide solution for three hours. This etching procedure was a selective etching, and the etching rate of porous layer 12 was about $10^5$ times as much as that of single-crystal semiconductor layer 13. Accordingly, the etching was completely ceased at the time when single-crystal semiconductor layer 13 was exposed, to thereby yield an SOI structure shown in FIG. 12E.

In order to smooth the surface, the substrate was further subjected to hydrogen annealing at 1050° C. for three hours and was cleaned to thereby ultimately yield an SOI substrate composed of single-crystal semiconductor layer 13 having a thickness of 100 nm and insulating layer 14 having a thickness of 100 nm, as shown in FIG. 12E.

Evaluation 3

The single-crystal semiconductor layer was removed from the above-prepared sample of SOI structure by alkali etching, and microgaps formed in the bonding interface were subjected to plane transmission electron microscopic (TEM) observation. As a result, rectangular microgaps, each having a side of from about 10 nm to about 20 nm and each side being substantially in parallel with either of the crystal orientations [110] and [$\bar{1}$10], were observed.

The microgaps had anisotropy and were uniformly scattered in the wafer plane. The density of the microgaps was about $2.5 \times 10^{10}$ per square centimeter, and the number thereof in this sample (8-inch wafer) was about $7.9 \times 10^{12}$.

The region including the microgaps was subjected to sectional TEM observation, and it was found that microgaps 7 were bent toward substrate 2 side and were present in the interface (bonding interface) between insulating layer 3 and substrate 2, as shown in FIG. 5. The depths (heights) of microgaps 7 were from about 1 nm to about 5 nm.

Microgaps 7 were not observed in the interface between the single-crystal semiconductor layer and the thermal oxidation layer but specifically in the bonding interface. Accordingly, metal impurities will be captured on the substrate side of the bonding interface.

Evaluation 4

To verify the effectiveness of the gettering site, the above-prepared sample of SOI structure was further subjected to a heat treatment and was analyzed by ICP-MS.

The analyzing method was as follows:

A total of 50 mL of ultrapure water was mixed with 50 mL of an aqueous 68% by weight $HNO_3$ solution, and 0.7 mL of an aqueous 38% by weight HF solution (hydrofluoric acid) was added to the resulting mixture to thereby yield an etchant. $HNO_3$ and HF were both ultrapure specification materials having a metal impurity concentration less than 10 ppt. The treatment prior to analysis was performed in a Class 1 clean draft chamber in a Class 1000 clean room. A total of 12 mL of the above-prepared etchant was applied onto the surface of the sample SOI wafer, and the sample was etched for ten minutes to thereby expose the surface of the buried insulating layer. The resulting etchant after etching was completely recovered in a polytetrafluoroethylene (Teflon: trade mark) evaporating dish and was referred to as "etching (single-crystal semiconductor layer)".

Next, the exposed insulating layer was decomposed with HF vapor in a gastight enclosure. After decomposition, 12 mL of an aqueous 40% by weight $HNO_3$ solution was applied onto the surface of the wafer and was allowed to stand for five minutes, was then recovered in a Teflon evaporating dish, and was referred to as "etching (thermal oxide film)". Metal impurities in the oxide film were recovered by the strong oxidizing capability of $HNO_3$, but the substrate was not etched, since HF was not added to the etchant. Thus, the heavy metal elements in the oxide film alone were recovered.

The substrate was further etched only about 500 nm with an etchant including 48.5 mL of ultrapure water, 48.5 mL of the $HNO_3$ solution and 3 mL of the HF solution. The resulting etchant was recovered in a Teflon evaporating dish and was referred to as "etching (substrate)".

Each of the above-obtained three etchants after etching was heated at 200° C. on a hot plate in a clean draft chamber to thereby evaporate the etchant completely. It took two hours to evaporate the etchant.

The evaporating dishes were then cooled to room temperature, and 1 mL each of an aqueous 1% by weight $HNO_3$ solution was added to each of the evaporating dishes to yield analysis samples.

The concentrations of metal impurities in each layer of the SOI wafer were determined using calibration curves obtained by ICP-MS, and the concentrations of metal impurities in atoms per square centimeter were calculated from the volume of the sample (1 mL), the atomic weight of the metal element in question, and the area of the wafer.

A blank test was performed using the remainder of the etchants used in the pre-treatment to thereby eliminate the effect of trace metal impurities which had been concentrated by complete etchant evaporation and the effect of dissolved contaminant from the evaporating dish. The blank test was performed using three samples for each etchant. As a result, the metal element concentration in terms of the concentration on the surface of wafer was less than $7 \times 10^8$ atoms per square centimeter in any etchant. Accordingly, the determination results of the recovered samples from wafer by ICP-MS were used as the metal element concentrations on the wafer surface.

Table 3 shows the results of quantitative analyses of metal impurities in individual layers of the SOI wafer.

TABLE 3

Unit: $\times 10^{10}$ (atoms/cm$^2$)

|  | Cr | Fe | Ni | Cu |
|---|---|---|---|---|
| Single-crystal Si layer | <0.5 | <0.5 | ≦0.5 | <0.5 |
| Thermal oxide film | <0.5 | <0.5 | <0.5 | <0.5 |
| Substrate | <0.5 | 1.2 | 0.7 | 11.9 |

COMPARATIVE EXAMPLE 1

An SOI wafer as a comparative sample was prepared in the same manner as in Example 1, except that a silicon wafer was thermally oxidized. Specifically, a silicon wafer as a substrate was thermally oxidized to form a thermal oxide film on its surface and was bonded with a first substrate to thereby yield an SOI wafer as a comparative sample. The resulting comparative sample SOI wafer was subjected to the heat treatment and was analyzed.

Table 4 shows the results of quantitative analyses of metal impurities in individual layers of the comparative sample SOI wafer.

TABLE 4

Unit: ×10$^{10}$ (atoms/cm$^2$)

|  | Cr | Fe | Ni | Cu |
|---|---|---|---|---|
| Single-crystal Si layer | <0.5 | <0.5 | <0.5 | 0.6 |
| Thermal oxide film | <0.5 | 0.6 | <0.5 | 5.8 |
| Substrate | <0.5 | <0.5 | <0.5 | 1.3 |

Microgaps as in Example 1 are not formed in an interface between a thermal oxide film and Si, which is formed in the formation of the thermal oxide film. Accordingly, microgaps shown in FIG. 5 were not formed in an interface between the oxide film and the substrate, which interface was formed by bonding of thermal oxide films with each other in the comparative sample.

Table 3 shows that, in the bonded SOI substrate obtained according to the invented method, heavy metal elements such as Fe, Ni and Cu contaminated in the substrate due to heat treatment can be effectively captured or gettered by microgaps in the bonding interface on the top of the substrate. Consequently, the single-crystal semiconductor layer (single-crystal Si layer) which is an active device region, on which a semiconductor element or device is formed, and the thermal oxide film are clean in spite of contamination of heavy metal elements in the sample.

In contrast, Table 4 shows that a large amount of Cu was accumulated in the thermal oxide film in the comparative sample obtained by bonding thermal oxide films with each other. Segregation of Cu in the oxide film causes deteriorated pressure resistance and invites chip yield to decrease.

Evaluation 5

The bonded SOI wafer manufactured according to Example 1 was put into a heat treatment furnace, and one point of its core portion was analyzed by SIMS. The profile of Cu concentration in the depth direction only had a peak in the vicinity of the surface of the bonding interface on the substrate side, and the integral of the peak area was 1.4×10$^{11}$ atoms per square centimeter. This result satisfactorily agrees with the quantitative result by ICP-MS. Agreement of the analysis result of one point with that of the mean in the plane means that contaminated Cu is uniformly captured in the wafer plane. Specifically, the gettering effect is available all over the wafer plane.

Evaluation 6

To qualitatively verify the strength (intensity) of the gettering capability of the gettering site formed according to Example 1, the following comparative test was performed.

A clean bulk Si substrate and the bonded SOI substrate manufactured according to Example 1 were respectively placed in the heat treatment furnace, and the concentration of Cu contained in a surface spontaneous oxidation film after heat treatment was analyzed by ICP-MS. The results are shown in Table 5. The results of this test show that the gettering capability of the gettering site of the SOI wafer obtained according to Example 1 is higher than that of bulk Si.

TABLE 5

Unit: ×10$^{10}$ (atoms/cm$^2$)

| Bulk Si | Invented SOI substrate |
|---|---|
| 4.0 | <0.5 |

In a p-type semiconductor substrate, Cu diffuses outward at low temperatures and is ultimately deposited on the surface, as described by Shabani, et al. in J. Electrochem. Soc., vol. 143, 2025 (1996). In the bulk Si, 4.0×10$^{10}$ atoms per square centimeter of Cu was detected, as shown in Table 5. In contrast, the invented SOI substrate had a Cu concentration less than 0.5×10$^{10}$ atoms per square centimeter, although these two substrates were simultaneously subjected to heat treatment. These results indicate that Cu was captured by the gettering site in the bonded SOI substrate according to the present invention, whereas part of Cu may be deposited on the surface in a bonded SOI wafer having no gettering site. Accordingly, the gettering site in the invented SOI substrate is proved to have a very high Cu gettering capability.

The results of Example 1 in Table 3 show that the configuration as shown in FIG. 1 is superior in the electrical properties of the chip to the conventional equivalent, in which a highly concentrated diffused phosphorus layer is formed under a single-crystal semiconductor layer and constitutes a gettering site, as described in Japanese Patent Laid-Open No. 6-163862. This is because the gettering site in the former configuration is a substrate portion, and segregation of heavy metal elements in this portion does not affect the characteristics of the resulting device. Accordingly, the formation of defects due to gettering of heavy metal elements in the single-crystal semiconductor layer can be avoided.

EXAMPLE 2

In Example 2, an SOI substrate was manufactured in a similar manner as in Example 1, except that part of the process of Example 1 was changed.

Specifically, the temperature of heat treatment for improving the strength of bonding portion was changed from 1100° C. to 1000° C. in this example.

The sizes and number of the formed gaps were not significantly different from those formed in the heat treatment at 1100° C.

Separately, when the temperature of a heat treatment for bonding was changed to 400° C., microgaps were not formed, and the resulting SOI substrate had localized voids on the order of from centimeters to millimeters due to unbonded atoms.

COMPARATIVE EXAMPLE 2

A comparative sample of SOI wafer was manufactured in a similar manner as in Example 1, except that the final cleaning operation of the substrates was changed to SC-1 cleaning with a cleaning solution composed of a dilute aqueous ammonia and dilute hydrogen peroxide. In this case, the entire surfaces of the substrates before bonding had spontaneous oxide film layers formed thereon, and the two surfaces to be bonded were each composed of silicon oxide.

The cross-section of the comparative sample was subjected to TEM observation to find that no microgap was formed, indicating that the hydrophilicity of the surfaces of substrates to be bonded plays an important role for the formation of microgaps.

COMPARATIVE EXAMPLE 3

An SOI wafer was manufactured in a similar manner as in Example 1, except that the atmosphere for bonding was changed to an inert gas atmosphere which does not react with Si. In the resulting SOI wafer, no microgap was formed.

Separately, the bonding procedure was performed in vacuo, and, as a result, no microgap was formed as in the above case. These results show that, for the formation of microgaps in the method according to Example 1, it is necessary to interpose moisture, oxygen, nitrogen, and other substances in the air within the interface after bonding.

EXAMPLE 3

A bonded SOI wafer was manufactured in the same manner as in Example 1, except that a substrate having a more roughed surface was used as the semiconductor substrate on which the porous layer was formed. As a result, the sizes of microgaps were not changed, but the number thereof was increased to $7.5 \times 10^{10}$ per square centimeter, about three times that in Example 1.

EXAMPLE 4

The number of microgaps formed in a bonding interface can be changed by controlling the temperature of the substrate at an early stage of the epitaxial growth process, in which a trace amount of monosilane gas is supplied to enhance the two-dimensional growth of a growing film.

In the present example, a trace amount of monosilane gas was supplied at an early stage of epitaxial growth in the method of Example 1, and the temperature of the substrate was set at 1100° C. to thereby sufficiently seal the surface pores of the porous layer. Subsequently, the material gas was changed to dichlorosilane gas, and epitaxial growth was performed at a high deposition rate.

The other procedure was the same as in Example 1.

Separately, an SOI substrate was manufactured in the same manner as above, except that the temperature of substrate at an early stage of the epitaxial growth process, in which a trace amount of monosilane gas was supplied, was changed from 1100° C. to 950° C. The SOI substrate manufactured at a substrate temperature of 950° C. had $1.3 \times 10^{11}$ per square centimeter of microgaps, about five times that in the SOI substrate manufactured at a substrate temperature of 1100° C., indicating that the number of microgaps can be optionally controlled by controlling the process temperature of the first substrate, on which the porous layer is formed.

These results show that the hydrophilicity of substrates to be bonded and the bonding atmosphere play important roles for the formation of microgaps. Additionally, the surface quality (surface roughness) of the substrate on which the porous layer is formed, the temperature of the substrate at an early stage of epitaxial growth, and the temperature of annealing oxidation after bonding play important roles on the size and number of the resulting microgaps.

Accordingly, the size and number of microgaps can be optionally controlled by optionally controlling the surface quality of the substrate on which the porous layer is formed, the substrate temperature at an early stage of epitaxial growth and by making the surfaces of substrates to be bonded hydrophobic prior to bonding, and by appropriately adjusting the temperature of annealing oxidation.

EXAMPLE 5

An 8-inch Si (100) p+-type semiconductor wafer having a resistivity of 0.015 Ωcm and a thickness of 725 μm was prepared. After cleaning, the substrate was subjected to anodization to form pores in a region ranging from the surface layer to a predetermined depth to thereby form a porous layer. In this procedure, the anodization was performed at a current density of 8.15 mAcm$^2$ for 11 minutes at an early stage of the formation of the porous layer to thereby form a first porous layer region having a relatively low porosity on the surface of the substrate. Subsequently, the substrate was further subjected to a treatment at a current density of 33 MA/cm$^2$ for 1 minute to thereby form a second porous layer region under the first porous layer region. The second porous layer region had a thickness less than, and a porosity higher than, the first porous layer region.

The substrate was then subjected to thermal oxidation at 400° C. for 60 minutes to thereby form an ultrathin thermal oxide film on the pore walls.

The oxide film on the layer surface of the porous layer was removed using a dilute hydrofluoric acid, and the substrate having the porous layer was placed in an epitaxial growth system. While supplying hydrogen gas into the epitaxial growth system, the temperature was raised to about 900° C.

Next, a single-crystal semiconductor layer 45 nm thick was formed by epitaxial growth.

Next, an insulating layer 50 nm thick was formed on top of the single-crystal semiconductor layer by wet oxidation, and the resulting semiconductor substrate was cleaned to thereby form a three-layer structure composed of the insulating layer, single-crystal semiconductor layer, and porous layer on the surface of the substrate.

Additionally, an Si (100) 8-inch Si wafer having a resistivity of 10 to 20 Ωcm and a thickness of 725 μm was prepared as second semiconductor substrate 15.

Immediately before bonding, the surfaces of the first semiconductor substrate on the side of the three-layer structure and of the second semiconductor substrate were cleaned with a dilute HF cleaning solution and were rinsed with pure water and dried.

The first semiconductor substrate having the three-layer structure was bonded with the second semiconductor substrate in the air in a Class 1 clean room.

While bonding, the bonded substrates were subjected to "annealing oxidation" as a heat treatment for bonding at 1100° C. in a gaseous mixture of nitrogen and oxygen for 60 minutes, in order to improve the bonding strength, thus providing a bonded substrate.

A wedge was inserted into a depression, formed by beveling of the wafer, on the side of the bonded substrate to thereby apply an external force so as to separate the bonded substrate into two parts. Thus, the porous layer region having a high porosity was cracked along the interface between the two porous layer regions having different porosities, and the bonded substrate was completely separated into two segments.

The porous layer exposed onto the surface of the second semiconductor substrate was etched with an etchant composed of a mixture of an aqueous 0.6% by weight HF solution and an aqueous 6.0% by weight $H_2O_2$ (hydrogen peroxide) solution.

The substrate was further subjected to hydrogen annealing at 1050° C. for three hours and was then cleaned to thereby ultimately yield an SOI substrate having a single-crystal semiconductor layer 20 nm thick and a buried insulating layer 50 nm thick.

Next, the SOI substrate was placed in a CVD system, and, into the CVD system, 30 slm of hydrogen gas, 100 sccm of monosilane gas, and 300 sccm of a diluted 2% by volume germane gas were supplied while maintaining the pressure at $1.3 \times 10^4$ Pa, the substrate was heated to 650° C. using a lamp and a germanium-silicon single-crystal layer having a Ge concentration of 30 atomic percentage and a thickness of 30 nm was formed by epitaxial growth. Thus, plural semiconductor layers having different compositions were formed on the insulating layer.

The bonding interface of the above prepared sample of SOI structure was subjected to plane TEM observation to thereby find microgaps as those observed in Example 1. The gettering effect of the sample of SOI structure was verified in the same manner as in Example 1.

EXAMPLE 6

A substrate having a porous layer was formed and an ultrathin thermal oxide film was formed on the walls of pores in the same manner as in Example 5.

The oxide film on the layer surface of the porous layer was removed with a dilute hydrofluoric acid, and the substrate having the porous layer was placed in an epitaxial growth system. While supplying hydrogen gas into the epitaxial growth system, the temperature was raised to about 900° C.

A single-crystal semiconductor layer 160 nm thick was then formed by epitaxial growth.

Next, a thermal oxide film 50 nm thick was formed on top of the single-crystal semiconductor layer by wet oxidation.

A second semiconductor substrate was prepared, and immediately before bonding, the surfaces of the first semiconductor substrate on the side of the three-layer structure and of the second semiconductor substrate were cleaned with a dilute HF cleaning solution, were rinsed with pure water and were dried in the same manner as in Example 5.

The first semiconductor substrate having the three-layer structure was bonded with the second semiconductor substrate in the air in a Class 1 clean room.

While bonding, the bonded substrates were subjected to "annealing oxidation" as a heat treatment for bonding at 1100° C. in a gaseous mixture of nitrogen and oxygen for 60 minutes in order to improve the bonding strength, thus providing a bonded substrate.

Next, the bonded substrate was completely separated into two segments, the porous layer exposed onto the surface of the second semiconductor substrate was removed by etching, and the substrate was then subjected to hydrogen annealing in the same manner as in Example 5.

The single-crystal semiconductor layer on the second semiconductor substrate was immersed in a mixture of aqueous ammonia and aqueous hydrogen peroxide solution at 80° C. to thereby remove the single-crystal semiconductor layer 115 nm thick to thereby ultimately yield an SOI substrate having a single-crystal semiconductor layer 20 nm thick and a buried thermal oxide film 50 nm thick.

The above-prepared SOI substrate was placed in a CVD system, and 30 slm of hydrogen gas, 100 sccm of monosilane gas, and 300 sccm of a diluted 2% by volume germane gas were supplied into the CVD system while maintaining the pressure at $1.3 \times 10^4$ Pa, the substrate was heated to 650° C. using a lamp and a germanium-silicon single-crystal layer having a Ge concentration of 30 atomic percentage and a thickness of 30 nm was formed by hetero-epitaxial growth.

The bonding interface of the above prepared sample of SOI structure was subjected to plane TEM observation to thereby find microgaps such as those observed in Example 1. The gettering effect of the sample of the SOI structure was verified in the same manner as in Example 1.

In the CVD process of the germanium-silicon layer as in Examples 5 and 6, the flow rates of hydrogen gas, of monosilane gas and of the diluted germane gas may be respectively selected in a range from about 25 to about 45 slm, in a range from 50 to about 200 sccm, and in a range form about 1 to about 500 sccm. The pressure can be selected within a range from about $1.3 \times 10^3$ Pa to $1.3 \times 10^4$ Pa, and the substrate temperature can be selected within a range from about 650° C. to about 680° C. The growth rate under these conditions was in a range from 10 nm/minute to 50 nm/minute.

The Ge concentration may vary in the thickness direction within a range from about 0 atomic percentage to 30 atomic percentage. An additional single-crystal silicon layer may be preferably formed on or above the germanium-silicon single-crystal layer.

The microgaps also serve to mitigate stress induced by the single-crystal semiconductor layer formed by heteroepitaxial growth, and it is preferred to form microgaps in the interface of the buried insulating layer on the SOI layer side, when two or more different single-crystal semiconductor layers are laminated as the SOI layer.

As is described above, the present invention can provide semiconductor members and semiconductor devices which are practical and have more satisfactory characteristics than conventional equivalents and can provide the methods for manufacturing these semiconductor members and devices.

Additionally, the present invention can provide semiconductor members and semiconductor devices which can maintain the mechanical strength of the semiconductor member and have a satisfactory gettering capability. The present invention can also provide methods for manufacturing these semiconductor members and semiconductor devices.

In addition and advantageously, the present invention can provide a method for manufacturing a semiconductor member, which can easily form a gettering site.

While the present invention has been described with reference to what are presently considered to be the preferred embodiments, it is to be understood that the invention is not limited to the disclosed embodiments. On the contrary, the invention is intended to cover various modifications and equivalent arrangements included within the sprit and scope of the appended claims. The scope of the following claims is to be accorded the broadest interpretation so as to encompass all such modifications and equivalent structures and functions.

What is claimed is:

1. A semiconductor member comprising:

a substrate;

an insulating layer formed on said substrate; and a semiconductor layer formed on said insulating layer, wherein said semiconductor member includes a monolayer region having plural microgaps for gettering metal impurities, said plural microgaps being arranged along an interface inside said semiconductor member, and wherein a concentration of Ni captured in said monolayer region is equal to or less than $5 \times 10^{10}$ per square centimeter.

2. A semiconductor member comprising:

a substrate;

an insulating layer formed on said substrate; and a semiconductor layer formed on said insulating layer, wherein said semiconductor member includes a monolayer region having plural microgaps for gettering metal impurities, said plural microgaps being arranged along an interface inside said semiconductor member, and wherein said microgaps are box-shaped having a lengthwise side 10 nm to 100 nm long and a widthwise side 10 nm to 100 nm long in a plane substantially in parallel with said interface or are not box-shaped but have an area equivalent to that of a box having a lengthwise side 10 nm to 100 nm long and a widthwise side 10 nm to 100 nm long.

3. A semiconductor member comprising:

a substrate, an insulating layer formed on said substrate; and a semiconductor layer formed on said insulating layer, wherein said semiconductor member includes a monolayer region having plural microgaps for gettering metal impurities, said plural microgaps being arranged along an interface inside said semiconductor member, and wherein a density of said microgaps in a plane along said interface is from $5 \times 10^9$ per square centimeter to $5 \times 10^{11}$ per square centimeter.

4. A semiconductor member comprising:

a substrate;

an insulating layer formed on said substrate; and a semiconductor layer formed on said insulating layer, wherein plural microgaps having a length from 10 nm to 100 nm and a width from 10 nm to 100 nm are dispersed and arranged at a density from $5 \times 10^9$ per square centimeter to $5 \times 10^{11}$ per square centimeter along a plane substantially in parallel with a surface of said semiconductor member.

5. A method for manufacturing a semiconductor member, said semiconductor member comprising a substrate, an insulating layer formed on said substrate, and a semiconductor layer formed on said insulating layer, and said semiconductor member including plural microgaps, said microgaps having a length from 10 nm to 100 nm and a width from 10 nm to 100 nm and being dispersed and arranged at a density from $5 \times 10^9$ per square centimeter to $5 \times 10^{11}$ per square centimeter along a plane substantially in parallel with a surface of said semiconductor member, said method comprising the steps of:

preparing a first substrate and a second substrate, said first substrate including a transfer layer region having said semiconductor layer; and transferring said transfer layer region from said first substrate to said second substrate, wherein said transferring step includes a step of bonding said first substrate with said second substrate so as to interpose said plural microgaps for gettering metal impurities between said first substrate and said second substrate.

6. A semiconductor device comprising:

a semiconductor member, said semiconductor member including a substrate, a buried insulating layer formed on said substrate, and a single-crystal semiconductor layer formed on said buried insulating layer; and a semiconductor element being formed on said single-crystal semiconductor layer of said semiconductor member, wherein plural microgaps having a length from 10 nm to 100 nm and a width from 10 nm to 100 nm are dispersed and arranged at a density from $5 \times 10^9$ per square centimeter to $5 \times 10^{11}$ per square centimeter along at least one interface of said buried insulating layer.

7. The semiconductor device according to claim 6, wherein metal impurities are captured by said microgaps.

8. A method for manufacturing a semiconductor device, said semiconductor device comprising a semiconductor member and a semiconductor element, said semiconductor member comprising a substrate, a buried insulating layer formed on said substrate, and a single-crystal semiconductor layer formed on said buried insulating layer, and said semiconductor element being formed on said single-crystal semiconductor layer of said semiconductor member, said method comprising the step of:

performing a heat treatment at least during or after a step of forming said semiconductor element, to thereby capture metal impurities by plural microgaps, said plural microgaps having a length from 10 nm to 100 nm and a width from 10 nm to 100 nm and being dispersed and arranged at a density from $5 \times 10^9$ per square centimeter to $5 \times 10^{11}$ per square centimeter along at least one interface of said buried insulating layer.

9. A semiconductor member comprising plural microgaps, said plural microgaps having a length from 10 nm to 100 nm and a width from 10 nm to 100 nm and being dispersed and arranged at a density from $5 \times 10^9$ per square centimeter to $5 \times 10^{11}$ per square centimeter along a plane substantially in parallel with a surface of said semiconductor member.

10. A method for manufacturing a semiconductor member, said semiconductor member comprising plural microgaps, said plural microgaps having a length from 10 nm to 100 nm and a width from 10 nm to 100 nm and being dispersed and arranged at a density from $5 \times 10^9$ per square centimeter to $5 \times 10^{11}$ per square centimeter along a plane substantially in parallel with a surface of said semiconductor member, said method comprising the steps of:

preparing a first substrate and a second substrate, said first substrate including a transfer layer region having a semiconductor layer; and transferring said transfer layer region from said first substrate to said second substrate, wherein said transferring step includes a step of bonding said first substrate with said second substrate so as to interpose said plural microgaps between said first substrate and said second substrate.

11. A semiconductor device comprising:

a semiconductor member including a single-crystal semiconductor layer; and a semiconductor element formed in said single-crystal semiconductor layer of said semiconductor member, wherein plural microgaps having a length from 10 nm to 100 nm and a width from 10 nm to 100 nm are dispersed and arranged along at least one interface at a density from $5 \times 10^9$ per square centimeter to $5 \times 10^{11}$ per square centimeter.

12. A method for manufacturing a semiconductor device, said semiconductor device comprising a semiconductor member including a single-crystal semiconductor layer; and a semiconductor element formed in said single-crystal semiconductor layer of said semiconductor member, said method comprising the step of:

performing a heat treatment at least during or after a step of forming said semiconductor element, to thereby capture metal impurities by plural microgaps, said plural microgaps having a length from 10 nm to 100 nm and a width from 10 nm to 100 nm and being dispersed and arranged along at least one interface at a density from $5 \times 10^9$ per square centimeter to $5 \times 10^{11}$ per square centimeter.

13. A method for manufacturing a semiconductor member, said semiconductor member comprising a substrate, an insulating layer formed on said substrate, and a semiconductor layer formed on said insulating layer, and said semiconductor member including a monolayer region having plural microgaps, said plural microgaps being arranged along an interface inside said semiconductor member, said method comprising the steps of:

preparing a first substrate and a second substrate, said first substrate including a transfer layer region having said semiconductor layer; and transferring said transfer layer region from said first substrate to said second substrate, wherein said transferring step includes a step of bonding said first substrate with said second substrate so as to interpose said plural microgaps for gettering a metal impurity between said first substrate and said second substrate, and wherein a concentration of Ni captured in said monolayer region is equal to or less than $5 \times 10^{10}$ per square centimeter.

14. A method for manufacturing a semiconductor member, said semiconductor member comprising a substrate, an insulating layer formed on said substrate, and a semiconductor layer formed on said insulating layer, and said semiconductor member including a monolayer region having plural microgaps, said plural microgaps being arranged along an interface inside said semiconductor member, said method comprising the steps of:

preparing a first substrate and a second substrate, said first substrate including a transfer layer region having said semiconductor layer; and transferring said transfer layer region from said first substrate to said second substrate, wherein said transferring step includes a step of bonding said first substrate with said second substrate so as to interpose said plural microgaps for gettering a metal impurity between said first substrate and said second substrate, and wherein said microgaps are box-shaped having a lengthwise side 10 nm to 100 nm long and a widthwise side 10 nm to 100 nm long in a plane substantially in parallel with said interface or are not box-shaped but have an area equivalent to that of a box having a lengthwise side 10 nm to 100 nm long and a widthwise side 10 nm to 100 nm long.

15. A method for manufacturing a semiconductor member, said semiconductor member comprising a substrate, an insulating layer formed on said substrate, and a semiconductor layer formed on said insulating layer, and said semiconductor member including a monolayer region having plural microgaps, said plural microgaps being arranged along an interface inside said semiconductor member, said method comprising the steps of:

preparing a first substrate and a second substrate, said first substrate including a transfer layer region having said semiconductor layer; and transferring said transfer layer region from said first substrate to said second substrate, wherein said transferring step includes a step of bonding said first substrate with said second substrate so as to interpose said plural microgaps for gettering a metal impurity between said first substrate and said second substrate, and wherein a density of said microgaps in a plane along said interface is from $5 \times 10^9$ per square centimeter to $5 \times 10^{11}$ per square centimeter.

* * * * *

UNITED STATES PATENT AND TRADEMARK OFFICE
CERTIFICATE OF CORRECTION

PATENT NO. : 6,639,327 B2
DATED : October 28, 2003
INVENTOR(S) : Kazutaka Momoi et al.

It is certified that error appears in the above-identified patent and that said Letters Patent is hereby corrected as shown below:

Column 10,
Line 23, "resent" should read -- present --.

Column 17,
Line 15, "cracked," should read -- crack, --.

Column 19,
Line 40, "mAcm$^2$" should read -- mA/cm$^2$ --.

Column 22,
Line 54, "$\leqq 0.5$" should read -- $< 0.5$ --.

Column 26,
Line 8, "mAcm$^2$" should read -- mA/cm$^2$ --.
Line 13, "MA/cm$^2$" should read -- mA/cm$^2$ --.

Column 28,
Line 11, "form" should read -- from --.

Signed and Sealed this

Tenth Day of August, 2004

JON W. DUDAS
*Acting Director of the United States Patent and Trademark Office*